United States Patent
Ii et al.

(10) Patent No.: US 7,740,917 B2
(45) Date of Patent: Jun. 22, 2010

(54) METHOD FOR FORMING THIN FILM AND BASE AND HAVING THIN FILM FORMED BY SUCH METHOD

(75) Inventors: Hiromoto Ii, Hachioji (JP); Toshio Tsuji, Hachioji (JP); Chikao Mamiya, Hachioji (JP); Kazuhiro Fukuda, Hachioji (JP); Kiyoshi Oishi, Hachioji (JP); Takakazu Kiyomura, Hiroshima (JP)

(73) Assignee: Konica Minolta Holdings, Inc., Tokyo (JP)

( * ) Notice: Subject to any disclaimer, the term of this patent is extended or adjusted under 35 U.S.C. 154(b) by 932 days.

(21) Appl. No.: 10/544,084

(22) PCT Filed: Jul. 8, 2004

(86) PCT No.: PCT/JP2004/010085

§ 371 (c)(1),
(2), (4) Date: Jul. 28, 2005

(87) PCT Pub. No.: WO2005/007927

PCT Pub. Date: Jan. 27, 2005

(65) Prior Publication Data

US 2006/0199014 A1    Sep. 7, 2006

(30) Foreign Application Priority Data

Jul. 16, 2003 (JP) .............................. 2003-197799
Feb. 16, 2004 (JP) .............................. 2004-037896

(51) Int. Cl.
*C23C 16/00* (2006.01)
*H05H 1/24* (2006.01)

(52) U.S. Cl. ....................... 427/576; 427/569; 427/457; 427/248.1

(58) Field of Classification Search ................ 427/569, 427/576

See application file for complete search history.

(56) References Cited

U.S. PATENT DOCUMENTS

| 5,290,609 | A | * | 3/1994 | Horiike et al. ............... 438/396 |
| 6,089,181 | A | * | 7/2000 | Suemasa et al. ........... 118/723 E |
| 6,200,893 | B1 | * | 3/2001 | Sneh ........................... 438/685 |
| 2001/0028924 | A1 | * | 10/2001 | Sherman ................. 427/255.28 |

(Continued)

FOREIGN PATENT DOCUMENTS

JP         A 2000-303175         10/2000

(Continued)

*Primary Examiner*—David Turocy
(74) *Attorney, Agent, or Firm*—Lucas & Mercanti, LLP

(57) ABSTRACT

A method for forming a film comprising a first process and a second process, the first process comprising the steps of: supplying a discharge gas to a first discharge space where high frequency electric field A is generated at or near atmospheric pressure, whereby the discharge gas is excite; transferring energy of the excited discharge gas to a film forming gas, whereby the film forming gas is excited; and exposing a substrate to the film forming gas to form a film on the substrate, and the second process comprising the steps of: supplying a gas containing an oxidizing gas to a second discharge space where high frequency electric field B is generated at or near atmospheric pressure, whereby the gas containing the oxidizing gas is excite; and the film formed in the first process is exposed to the excited gas containing the oxidizing gas.

24 Claims, 5 Drawing Sheets

U.S. PATENT DOCUMENTS

| | | | |
|---|---|---|---|
| 2002/0043216 A1* | 4/2002 | Hwang et al. | 118/723 VE |
| 2003/0082412 A1 | 5/2003 | Fukuda | |
| 2003/0111962 A1 | 6/2003 | Shannon | |
| 2003/0113479 A1* | 6/2003 | Fukuda et al. | 427/569 |
| 2003/0232136 A1* | 12/2003 | Fukuda et al. | 427/248.1 |

FOREIGN PATENT DOCUMENTS

| | | |
|---|---|---|
| JP | 1055747 | 11/2000 |
| JP | A 2002-110397 | 4/2002 |

\* cited by examiner

METHOD FOR FORMING THIN FILM AND BASE AND HAVING THIN FILM FORMED BY SUCH METHOD

TECHNICAL FIELD

The present invention relates to a layer forming method employing atmospheric pressure plasma discharge processing, and a substrate having a film formed by the method.

BACKGROUND OF THE INVENTION

A method is known in which a film is obtained employing an atmospheric pressure plasma discharge processing method using a mixed gas of a rare gas and a film forming gas (see, for example, Patent Document 1). In this method, so far, when a low cost gas other than a rare gas, for example, oxygen, nitrogen or carbon dioxide in air, is used as a discharge gas, strength of electric field (hereinafter referred to also as electric field strength) becomes high and a stable discharge have not been fully easy to obtain under a conventional high frequency electric field. Accordingly, a stable film forming have not been fully easy.

Also, disclosed is a method in which a stable film forming is attained by obtaining a stable discharge using a superposed electric field of a pulsed high frequency electric field and a pulsed direct current electric field under a discharge gas of argon (see, for example, Patent Document 2).

However, these conventional methods have not been fully satisfactory in obtaining a high quality metal oxide film when a production rate is increased. For example, when a metal oxide film of $TiO_2$ or $SiO_2$ was formed on a substrate, adhesiveness between the film and the substrate degraded with time or when a transparent conductive film formed of a metal oxide doped with a metal was prepared, a satisfactory low resistivity tends not to be obtained. Also, thus obtained transparent conductive film was found to exhibit a low etching rate. Another problem has been a higher production cost due to the use of a rare gas, for example, argon as a discharge gas.

(Patent Document 1) Japanese Patent Publication Open to Public Inspection (hereafter referred to as JP-A) No. 2000-303175

(Patent Document 2) JP-A No. 2002-110397

The present invention has been aimed to overcome these problems. An object of the present invention is to provide a film forming method and a substrate having thereon a film produced by the film forming method, the film forming method attaining at least one of the following aspects:

1. Forming a high quality film with a high production rate; and
2. Forming a film with a low production cost.

DISCLOSURE OF THE INVENTION

The above mentioned object of the present invention has been achieved by the following structures.

(1) A method for forming a film comprising:
a first process, wherein:
a discharge gas is supplied to a first discharge space where high frequency electric field A is generated at or near atmospheric pressure, whereby the discharge gas is excite;
energy of the excited discharge gas is transferred to a film forming gas, whereby the film forming gas is excited; and
a substrate is exposed to the exited film forming gas to form a film on the substrate, and
a second process, wherein:
a gas containing an oxidizing gas is supplied to a second discharge space where high frequency electric field B is generated at or near atmospheric pressure, whereby the gas containing the oxidizing gas is excite; and
the film formed in the first process is exposed to the excited gas containing the oxidizing gas.

(2) A method for forming a film comprising:
a first process, wherein:
a discharge gas is supplied to a first discharge space where high frequency electric field A is generated at or near atmospheric pressure, whereby the discharge gas is excite;
a film forming gas is put in contact with the excited discharge gas; and
a substrate is exposed to the film forming gas put in contact with the excited discharge gas to form a film on the substrate, and
a second process, wherein:
a gas containing an oxidizing gas is supplied to a second discharge space where high frequency electric field B is generated at or near atmospheric pressure, whereby the gas containing the oxidizing gas is excite; and
the film formed in the first process is exposed to the excited gas containing the oxidizing gas.

(3) A method for forming a film comprising:
a first process, wherein:
gas 1 containing a film forming gas is supplied to a first discharge space where high frequency electric field A is generated at or near atmospheric pressure, whereby gas 1 is excite; and
a substrate is exposed to exited gas 1 to form a film on the substrate, and
a second process, wherein:
gas 2 containing a oxidizing gas is supplied to a second discharge space where high frequency electric field B is generated at or near atmospheric pressure, whereby gas 2 is excite;
the film formed in the first process is exposed to excited gas 2 containing the oxidizing gas.

(4) The method of Item (3), wherein:
high frequency electric field A is formed by superposing a first high frequency electric field and a second high frequency electric field;
gas 1 contains a discharge gas and a reducing gas in addition to the film forming gas; and
the discharge gas contains nitrogen of which content is 50% by volume or more based on a volume of the discharge gas.

(5) The method of Item (4), wherein the reducing gas is hydrogen.

(6) The method of any one of Items (3) to (5), wherein:
a discharge space of the first process is formed between a first electrode and a second electrode which are facing each other; and
the first high frequency electric field is applied by the first electrode and the second high frequency electric field is applied by the second electrode.

(7) The method of any one of Items (3) to (7), wherein:
a frequency of the second high frequency electric field $\omega 2$ is higher than a frequency of the first high frequency electric field $\omega 1$;

intensity of the first high frequency electric field V1, intensity of the second high frequency electric field V2, and intensity of discharge starting electric field IV1 satisfy one of the formulas:

$$V1 \geq IV1 > V2 \text{ and } V1 > IV1 \geq V2; \text{ and}$$

a power density of the second high frequency electric field is not less than 1 W/cm$^2$.

(8) The method of Item (7), wherein:
high frequency electric field B is formed by superposing a third high frequency electric field and a fourth high frequency electric field.

(9) The method of Item (8), wherein:
a discharge space of the second process is formed between a third electrode and a fourth electrode which are facing each other; and
the third high frequency electric field is applied by the third electrode and the fourth high frequency electric field is applied by the fourth electrode.

(10) The method of any one of Items (3) to (9), wherein the first electrode and the third electrode are common.

(11) The method of Item (8) or Item (9), wherein:
a frequency of the fourth high frequency electric field ω4 is higher than a frequency of the third high frequency electric field ω3;
intensity of the third high frequency electric field V3, intensity of the fourth high frequency electric field V4, and intensity of discharge starting electric field IV2 satisfy one of the formulas:

$$V3 \geq IV2 > V4 \text{ and } V3 > IV2 \geq V4; \text{ and}$$

a power density of the fourth high frequency electric field is not less than 1 W/cm$^2$.

(12) The method of any one of Items (3) to (11), wherein the film is a metal oxide film.

(13) The method of any one of Items (3) to (12), wherein the film is a transparent conductive film.

(14) The method of any one of Items (3) to (13), wherein the film forming gas contains an organo-metallic compound having a metal atom selected from the group consisting of indium (In), tin (Sn), zinc (Zn), zirconium (Zr), antimony (Sb), aluminum (Al), gallium (Ga) and germanium (Ge).

(15) The method of any one of Items (3) to (14), wherein the first process and the second process are alternately repeated a plurality of times.

(16) The method of any one of Items (3) to (15), wherein a thickness of the accumulated film in the first process per batch is not more than 10 nm.

(17) A method for forming a film comprising:
a first process, wherein:
gas 1 containing a film forming gas is supplied to a discharge space at or near atmospheric pressure;
high frequency electric field A is applied to the discharge space, whereby gas 1 is excited; and
a substrate is exposed to excited gas 1 to form a film on the substrate,
wherein
high frequency electric field A is formed by superposing a first high frequency electric field and a second high frequency electric field;

a frequency of the first high frequency electric field represented by ω1 is high than a frequency of the second high frequency electric field represented by ω2;
intensity of the first high frequency electric field represented by V1, intensity of the second high frequency electric field represented by V2, and intensity of discharge starting electric field represented by IV1 satisfy one of the following formulas:

$$V1 \geq IV1 > V2 \text{ and } V1 > IV1 \geq V2;$$

a power density to give the second high frequency electric field is not less than 1 W/cm$^2$;
gas 1 contains a reducing gas and 50% by volume or more of nitrogen gas based on a volume of a discharge gas in addition to the film forming gas; and
the film forming gas contains an organo-titanium compound, and
a second process, wherein
gas 2 containing an oxidizing gas is supplied to a discharge space at or near atmospheric pressure;
high frequency electric field B is applied to the discharge space, whereby gas 2 is excited; and
a substrate having thereon a film formed by gas 1 is exposed to exited gas 2.

(18) The method of Item (17), wherein the reducing gas is hydrogen.

(19) The method of Item (17) or Item (18), wherein
the discharge space of the first process is formed between a first electrode and a second electrode which are facing each other; and
the first high frequency electric field is applied by the first electrode and the second high frequency electric field is applied by the second electrode.

(20) The method of any one of Items (17) to (19), wherein:
high frequency electric field B is formed by superposing a third high frequency electric field and a fourth high frequency electric field.

(21) The method of Item (20), wherein:
the discharge space of the second process is formed between a third electrode and a fourth electrode which are facing each other; and
the third high frequency electric field is applied by the third electrode and the fourth high frequency electric field is applied by the fourth electrode.

(22) The method of any one of Items (17) to (21), wherein the first electrode and the third electrode are common.

(23) The method of any one of Items (20) to (22), wherein:
a frequency of the fourth high frequency electric field ω4 is higher than a frequency of the third high frequency electric field represented by ω3;
intensity of the third high frequency electric field V3, intensity of the fourth high frequency electric field V4, and intensity of discharge starting electric field IV2 satisfy one of the following formulas:

$$V3 \geq IV2 > V4 \text{ and } V3 > IV2 \geq V4; \text{ and}$$

a power density of the fourth high frequency electric field is not less than 1 W/cm$^2$.

(24) The method of any one of Items (17) to (23), wherein the first process and the second process are alternately repeated a plurality of times.

(25) The method of Items (17) to (24), wherein a thickness of the film accumulated in the first process per time is not more than 20 nm.

(26) A substrate having thereon the film formed by the method of Items (3) to (25).

BEST MODE TO CARRY OUT THE INVENTION

Figure 1:
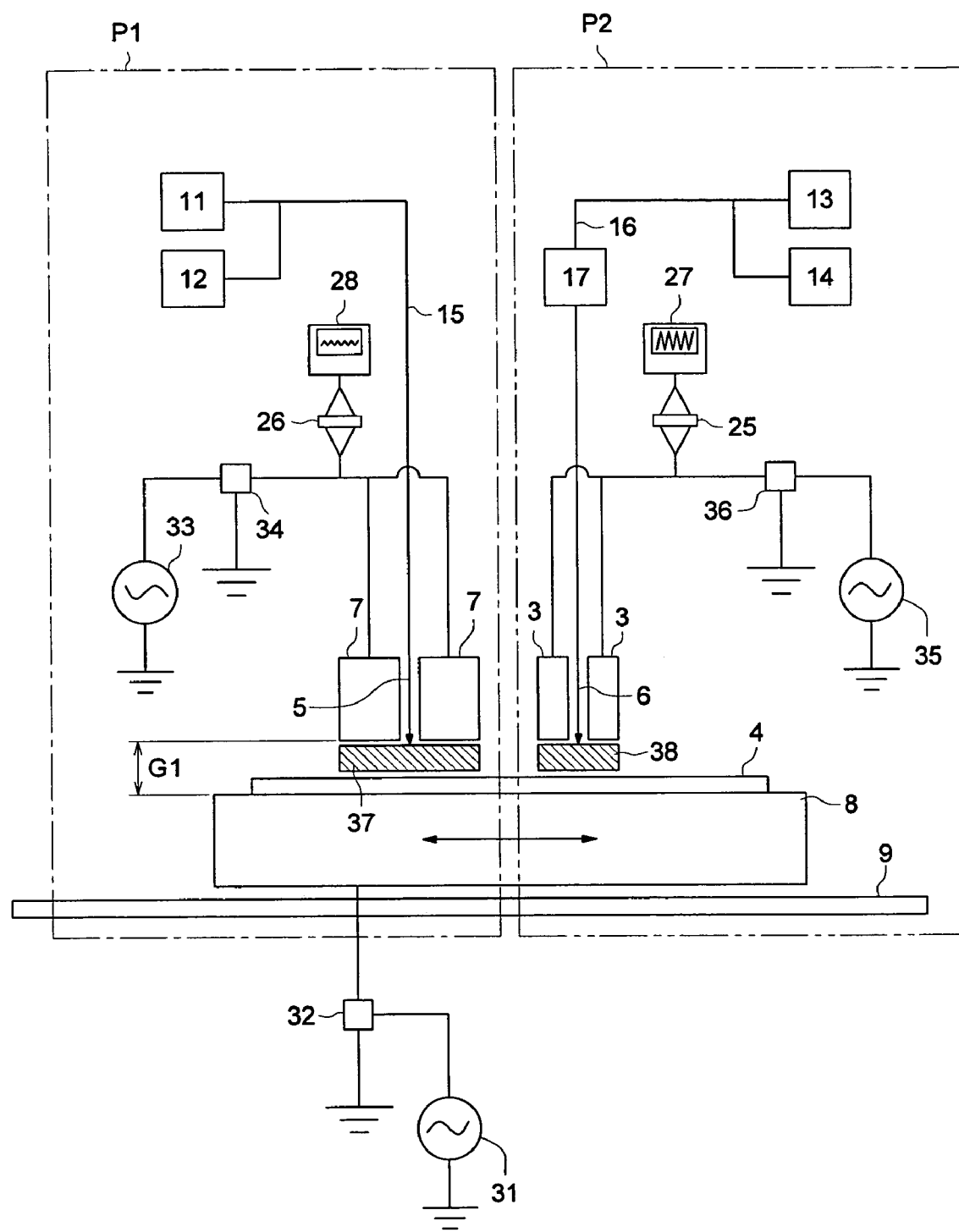
FIG. 1 is a schematic construction diagram illustrating an apparatus for atmospheric pressure plasma processing having flat electrodes of the present invention.

One of the aspects of the present invention is that: in the first process, a film is formed by treating a film forming gas in an atmospheric pressure plasma apparatus and, in the second process, a high quality film is obtained by treating the formed film in an atmospheric pressure plasma apparatus under an oxidizing atmosphere, and, further, formation of a film in a high forming rate with a low production cost has become possible by satisfying the following conditions.

In the following, the present invention will be detailed.

In the present invention, it was found that a high quality film can be obtained even in a high forming rate by at least carrying out the first process in which:

gas 1 containing a film forming gas is supplied to a discharge space;

gas 1 is excited by applying high frequency electric field A in the discharge space at or near atmospheric pressure; and a film is formed by exposing a substrate to excited gas 1, followed by carrying out the second process in which:

gas 2 containing a oxidizing gas is supplied to a discharge space;

gas 2 is excited by applying high frequency electric field B at or near atmospheric pressure; and the substrate having the film is exposed to excited gas 2.

Further, in the present invention, it was found that a high quality film can be obtained even in a high forming rate with a low production cost by at least carrying out the first process in which:

high frequency electric field A is formed by superposing a first high frequency electric field and a second high frequency electric field;

a frequency of the first high frequency electric field $\omega 1$ is higher than a frequency of the second high frequency electric field $\omega 2$;

intensity of the first high frequency electric field represented by V1, intensity of the second high frequency electric field represented by V2, and intensity of discharge starting electric field represented by IV1 satisfy one of the formulas:

$$V1 \geq IV1 > V2 \text{ and } V1 > IV1 \geq V2;$$

a power density to give the second high frequency electric field is not less than 1 W/cm².

gas 1 contains a reducing gas and 50% by volume or more of nitrogen gas based on a volume of a discharge gas in addition to the film forming gas; and the film forming gas contains an organic compound containing titanium, followed by carrying out the second process in which:

gas 2 containing a oxidizing gas is supplied to a discharge space;

gas 2 is excited by applying high frequency electric field B is at or near atmospheric pressure; and the substrate having the film is exposed to excited gas 2.

In the present invention, the plasma discharge processing is carried out at or near atmospheric pressure. The atmospheric pressure or the near atmospheric pressure means the pressure of 20 kPa to 110 kPa, and, preferably, the pressure is 93 kPa to 104 kPa to obtain a high quality film described in the present invention.

Gas 1 supplied to the space formed between the electrodes facing each other (the discharge space) at least contains a discharge gas which is excited by an electric field and a film forming gas which becomes excited by receiving the energy of the excited discharge gas and forms a film.

In the film forming method of the present invention, when a discharge gas containing a rare gas, for example, helium or argon, the production cost of a film largely depends on the cost of the discharge gas. Accordingly, in the present invention, the discharge gas preferably contains not less than 50% of nitrogen based on the volume of the discharge gas and more preferably contains a reducing gas to increase the film forming rate.

In the present invention, it is necessary to carry out the second process after the first process, in which:

gas 2 containing an oxidizing gas is supplied to a discharge space;

gas 2 is excited by applying high frequency electric field B at or near atmospheric pressure; and the substrate having the film is exposed to excited gas 2.

Gas 2 preferably contains a discharge gas, and the discharge gas preferably contains not less than 50% of nitrogen with respect to the production cost.

Figure 7:
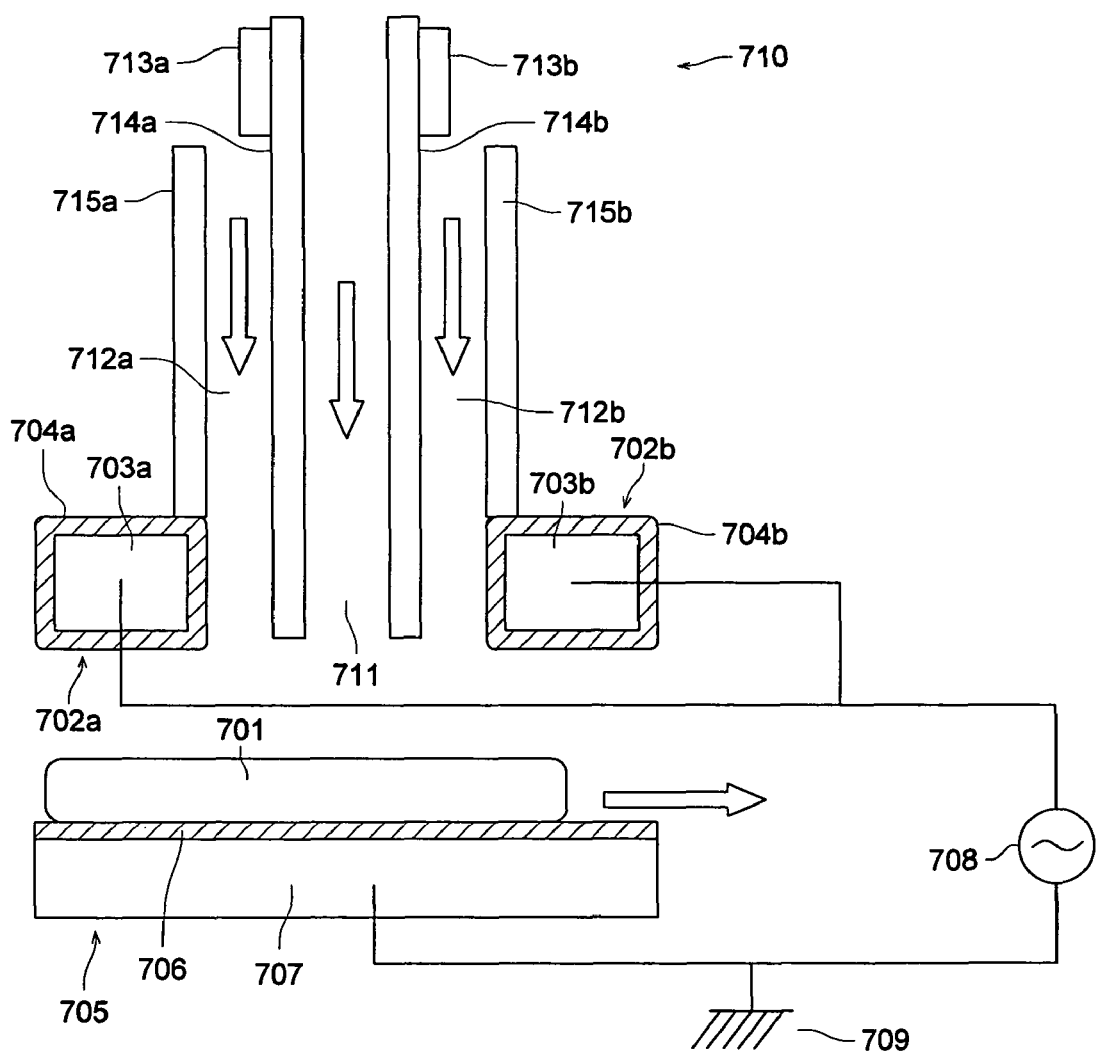
FIG. 7 is a schematic construction diagram illustrating example of an apparatus for separately supplying a discharge gas and a film forming gas.

An example of the process described as one of the embodiments of the present invention is illustrated in FIG. 7. In this process, a discharge gas is supplied to a discharge space to excite the discharge gas, after that, the excited discharge gas is put in contact with a film forming gas.

Preferably, the first process and the second process are alternately repeated. Applicable is either a method on which a substrate is treated by moving back and forth between the first process and the second process, or a method in which a substrate is continuously treated by moving through alternately placed first process regions and second process regions.

Between the electrodes of the first process and the second process, a blocking pate or an evacuating facility may be provided in order to avoid mixing of the gases used in each process. The blocking plate and the evacuating facility are not specifically limited.

High frequency electric field A is preferably formed by superposing the first high frequency electric field and the second high frequency electric field. The discharge space is formed between the first electrode and the second electrode which are facing each other, and preferably, the first high frequency electric field is applied by the first electrode and the second high frequency electric field is applied by the second electrode.

Preferable are those:

the frequency of the first high frequency electric field $\omega 1$ is higher than a frequency of the second high frequency electric field $\omega 2$;

the intensity of the first high frequency electric field represented by V1, the intensity of the second high frequency electric field represented by V2, and intensity of discharge starting electric field represented by IV1 satisfy one of the formulas:

$$V1 \geq IV1 > V2 \text{ and } V1 > IV1 \geq V2; \text{ and}$$

the power density to give the second high frequency electric field is not less than 1 W/cm$^2$.

When each of the high frequency electric fields to be superposed takes the form of a sine wave, the superposed electric field of the first high frequency electric field having the frequency of $\omega 1$ and the second high frequency electric field having the frequency of $\omega 2$ which is higher than $\omega 1$ takes the form of a saw-tooth wave in which the sine wave of $\omega 2$ which is higher than $\omega 1$ is superposed on the sine wave of $\omega 1$.

In the present invention, intensity of discharge starting electric field represents lowest intensity of the electric field which can initiate discharge in an actual discharge space (for example, configuration of electrode) under an actual reaction condition (for example, used gases) used for the film forming method. The intensity of discharge starting electric field depends, to a certain degree, on the kind of supplied gas to the discharge space, the kind of the dielectric material used for the electrode, and the distance between the electrodes, however, in the same discharge space, it depends on the intensity of discharge starting electric field of the discharge gas.

By applying a high frequency electric field as described above to a discharge space, discharge necessary to form a film is initiated and a high density plasma necessary to form a film is generated.

In the above description, superposition of continuous sine waves are explained, however, the present invention is not limited only to that. Both electric fields may be of continuous waves, or only one of the electric fields may be a continuous wave and another may be a pulse wave. Further, a third electric field may be used.

Herein, the intensity of high frequency electric field (high frequency electric field intensity) and intensity of discharge starting electric field represent the values determined by the methods described below.

Measuring Method of High Frequency Electric Field Intensity $V_1$ and $V_2$ (kV/mm):

High frequency voltage probe (P6015A) is placed at each electrode output signal of which is connected to oscilloscope TDS 3012B (produced by Techtronix Co., Ltd.), and electric field intensity is measured.

Measuring Method of Intensity of Electric Field at which Discharge is Initiated IV (kV/mm):

Discharge gas is supplied to a discharge space between the electrodes, and when electric field intensity applied to the electrodes is increased, electric field intensity at which discharge starts is defined as intensity of discharge starting electric field IV. The measuring device is the same as described above for the measurement of high frequency electric field.

When discharge conditions in the present invention are employed, even a gas with high intensity of discharge starting electric field such as a nitrogen gas can start discharge, and stable plasma with high density is maintained to form a film in a high forming rate.

When discharge gas is a nitrogen gas, its intensity of discharge starting electric field (½ Vp–p) is approximately 3.7 kV/mm, and the nitrogen gas can be excited by application of a first high frequency electric field intensity of $V_1 \geq 3.7$ kV/mm to be in plasma state.

The frequency of the first power supply is preferably not more than 200 kHz. The electric field waveform may be a pulse wave or a continuous wave. The lower limit of the frequency is preferably about 1 kHz.

The frequency of the second power supply is preferably not less than 800 kHz. As the frequency of the second power supply is increased, plasma density becomes higher, resulting a film with higher quality. The upper limit of the frequency is preferably about 200 MHz.

The application of high frequency electric field from two power supplies as described above is necessary in the present invention, in order to start discharge of a discharge gas having a high intensity of discharge starting electric field in the first high frequency electric field. Also, it is important to form a dense and high quality film by increasing plasma density with the high frequency and high power density of the second high frequency electric field. Further, the power density of the second high frequency electric field can be increased while uniform discharge is maintained by increasing employing the power density of the first high frequency electric field, whereby more uniform plasma with higher density can be produced, resulting in improvement of film forming rate and film quality.

As described above, a film is formed on a substrate by: starting discharge between electrodes facing each other; exciting gas 1 containing a film forming gas to a plasma state, gas 1 being supplied to the space between the above electrodes facing each other; and exposing a substrate a to excited gas 1. The substrate may be left at rest or moving while a film is formed.

Next the second process will be explained.

In the present invention, it is necessary that the second process is carried out, in which, subsequently to the first process, gas 2 containing an oxidizing gas is excited by an atmospheric pressure plasma processing; and the film above described is exposed to excited gas 2. Thus, a high quality film is formed even in a high forming rate.

High frequency electric field B is also preferably formed by superposing the third high frequency electric field and the fourth high frequency electric field. The discharge space is formed between the third electrode and the fourth electrode which are facing each other, and preferably, the third high frequency electric field is applied by the third electrode and the fourth high frequency electric field is applied by the fourth electrode. Thus, a dense and high quality film is formed.

Preferable for forming a high quality film is that:

a frequency of the third high frequency electric field represented by $\omega 3$ is higher than a frequency of the fourth high frequency electric field represented by $\omega 4$;

intensity of the third high frequency electric field represented by V3, intensity of the fourth high frequency electric field represented by V4, and intensity of discharge starting electric field represented by IV2 satisfy one of the formulas:

V3≧IV2>V4 and V3>IV2≧V4; and a power density of the fourth high frequency electric field is not less than 1 W/cm².

The third power supply and the fourth power supply which supply the third electric field and the fourth electric field, respectively, and the method of power supply are the same described for the first electric field and the second electric field in the first process.

<Electrode Gap>

When only one of the electrodes has a dielectric layer, the space distance between the first and second electrodes facing each other is a minimum distance between the dielectric layer surface and the conductive metal base material surface of the other electrode, and, when each of the facing electrodes described above have a dielectric layer, the space distance is a minimum distance between the both dielectric layer surfaces. The space distance is determined considering thickness of a dielectric layer provided on the conductive metal base material, magnitude of strength of electric field applied, or an object of employing plasma. The space distance is preferably, from 0.1 to 5 mm, and more preferably from 0.5 to 2 mm, in carrying out uniform discharge.

<Vessel>

The apparatus for the atmospheric pressure plasma processing of the present invention is preferably enclosed in one vessel or enclosed in two vessels in which the first process and the second process are separately enclosed, in order to avoid an effect of outside air. The is preferably a vessel of pyrex (R) glass, however, a vessel of metal may be used if insulation from the electrodes is secured. For example, the vessel may be a vessel of aluminum or stainless steel laminated with a polyimide resin or a vessel of the metal which is thermally sprayed with ceramic to form an insulation layer on the surface.

<Power Source>

Examples of the first power source (high frequency power source) and the third power source (high frequency power source) equipped in the atmospheric pressure plasma processing apparatus of the present invention include the following power sources available on the market:

| Maker | Frequency | Trade name |
|---|---|---|
| Shinko Denki | 3 kHz | SPG3-4500 |
| Shinko Denki | 5 kHz | SPG5-4500 |
| Kasuga Denki | 15 kHz | AGI-023 |
| Shinko Denki | 50 kHz | SPG50-4500 |
| Heiden Kenkyusho | 100 kHz* | PHF-6k |
| Pearl Kogyo | 200 kHz | CF-2000-200k |
| Pearl Kogyo | 400 kHz | CF-2000-400k |

Any power source of the above can be used in the present invention.

Examples of the second power source (high frequency power source) and the fourth power source (high frequency power source) include the following power sources available on the market:

| Maker | Frequency | Trade name |
|---|---|---|
| Pearl Kogyo | 800 kHz | CF-2000-800k |
| Pearl Kogyo | 2 MHz | CF-2000-2M |
| Pearl Kogyo | 13.56 MHz | CF-2000-13M |
| Pearl Kogyo | 27 MHz | CF-2000-27M |
| Pearl Kogyo | 150 MHz | CF-2000-150M |

Any power source of the above can be used in the present invention. In the power sources above, "*" represents an impulse high frequency power supply (100 kHz in continuous mode) manufactured by Heiden Kenkyusho, and others are high frequency power supplies capable of applying electric field with only continuous sine wave.

<Electric Power>

In the present invention, when power is supplied across the facing electrodes, power (power density) of not less than 1 W/cm² is supplied to the second electrode (the second high frequency electric field) and to the fourth electrode (the fourth high frequency electric field) to generate plasma, and give the resulting energy to gas 1 or gas 2. The upper limit of power supplied to the second electrode is preferably 50 W/cm², and more preferably 20 W/cm². The lower limit of power supplied is preferably 1.2 W/cm². The discharge surface area (cm²) refers to the surface area of the electrode at which discharge occurs.

Further, power density can be improved while uniformity of the second high frequency electric field is maintained, by supplying power (power density) of not less than 1 W/cm² to the first electrode (first high frequency electric field) and the third electrode (third high frequency electric field), whereby more uniform plasma with higher density can be produced, resulting in improvement of film forming rate and film quality. Power supplied to the first electrode and the third electrode is preferably not less than 5 W/cm². The upper limit of power supplied to the first electrode and the third electrode is preferably 50 W/cm².

<Electric Current>

Herein, the relationship between the currents of the first electric field I1 and the second electric field I2 is preferably I1<I2. I1 is preferably 0.3 mA/cm² to 20 mA/cm², and more preferably 1.0 mA/cm² to 20 mA/cm², and I2 is preferably 10 mA/cm² to 1000 mA/cm², and more preferably 20 mA/cm² to 500 mA/cm².

The relationship between the currents of the third electric field I3 and the fourth electric field I4 is preferably I3<I4. I3 is preferably 0.3 mA/cm² to 20 mA/cm², and more preferably 1.0 mA/cm² to 20 mA/cm². I4 is preferably 10 mA/cm² to 1000 mA/cm², and more preferably 20 mA/cm² to 500 mA/cm².

<Waveform>

Herein, the waveform of the high frequency electric field is not specifically limited. There are a continuous oscillation mode which is called a continuous mode with a continuous sine wave and a discontinuous oscillation mode which is called a pulse mode carrying out ON/OFF discontinuously, and either may be used, however, a method supplying the continuous sine wave at least to the second electrode side (the second high frequency electric field) is preferred in obtaining a uniform film with high quality.

<Electrodes>

It is necessary that electrodes used in the atmospheric pressure plasma film forming method structurally and functionally resist the use under severe conditions. Such electrodes are preferably those in which a dielectric is coated on a metal base material.

In the dielectric coated electrode used in the present invention, the dielectric and metal base material used in the present invention are preferably those in which their properties meet. For example, one embodiment of the dielectric coated electrodes is a combination of conductive metal base material and a dielectric in which the difference in linear thermal expansion coefficient between the conductive base material and the dielectric is not more than $10 \times 10^{-6}/°$ C. The difference in linear thermal expansion coefficient between the conductive metal base material and the dielectric is preferably not more than $8 \times 10^{-6}/°$ C., more preferably not more than $5 \times 10^{-6}/°$ C., and most preferably not more than $2 \times 10^{-6}/°$ C. Herein, the linear thermal expansion coefficient is a known physical value specific to materials.

Combinations of conductive base material and dielectric having a difference in linear thermal expansion coefficient between them falling within the range as described above will be listed below.

1. A combination of pure titanium or titanium alloy as conductive metal base material and a thermal spray ceramic layer as a dielectric layer 2: A combination of pure titanium or titanium alloy as conductive metal base material and a glass lining layer as a dielectric layer 3: A combination of stainless steel as conductive metal base material and a thermal spray ceramic layer as a dielectric layer 4: A combination of stainless steel as conductive metal base material and a glass lining layer as a dielectric layer 5: A combination of a composite of ceramic and iron as conductive metal base material and a thermal spray ceramic layer as a dielectric layer 6: A combination of a composite of ceramic and iron as conductive metal base material and a glass lining layer as a dielectric layer 7: A combination of a composite of ceramic and aluminum as conductive metal base material and a thermal spray ceramic layer as a dielectric layer 8: A combination of a composite of ceramic and aluminum as conductive metal base material and a glass lining layer as a dielectric layer In view of the difference in the linear thermal expansion coefficient, the combinations of 1, 2, and 5 through 8 above are preferred, and the combination of 1 above is more preferred.

In the present invention, titanium or titanium alloy is especially preferred as a metal base material with respect to the above properties. The electrode in which the above described dielectric is coated on the titanium or titanium alloy as a metal base material can resist the long term use under severe conditions without causing cracking, peeling or exfoliation.

The metal base material used in the present invention is a titanium alloy or a titanium metal each containing not less than 70% by weight of titanium. The titanium content of the titanium alloy or titanium metal in the present invention may be not less than 70% by weight, but is preferably not less than 80% by weight. As the titanium alloy or titanium metal in the present invention, those generally used such as pure titanium for industrial use, corrosion resistant titanium, and high strength titanium. Examples of the titanium for industrial use include TIA, TIB, TIC and TID, each of which contains a minute amount of an iron atom, a carbon, atom, a nitrogen atom, an oxygen atom or a hydrogen atom and not less than 99% by weight of titanium. The corrosion titanium is preferably T15PB, which contains a minute amount of the atom described above or lead, and not less than 98% by weight of titanium. The titanium alloy is preferably T64, T325, T525 or TA3, each of which contains a minute amount of the atom described above except for lead, aluminum, vanadium or tin, and not less than 85% by weight of titanium. Coefficient of thermal expansion of the titanium alloy or titanium metal described above is almost a half of that of stainless steel, for example, AISI316. The titanium alloy or titanium metal, which is used as a metal base material, is well combined with a dielectric described later, where the dielectric layer is coated on the metal base material, which provide high heat resistance and high durability.

The dielectric in the present invention is preferably an inorganic compound having a dielectric constant of from 6 to 45 as its characteristics. Examples of such an electrode include ceramic such as alumina or silicon nitride, and a glass lining material such as silicate glass or borate glass. Of these, a dielectric layer is coated on the electrode preferably by thermal spraying of ceramic or by glass-lining, and more preferably by thermal spraying of alumina.

As one embodiment of electrodes capable of resisting a high electric power as described above, the electrode has a dielectric layer with a void volume of not more than 10% by volume, preferably not more than 8% by volume, and most preferably from more than zero to 5% by volume. The void volume of the dielectric layer can be measured employing a BET adsorption method or a mercury porosimeter. In the examples described later, the void volume of a dielectric layer coated on a conductive metal base material was measured employing a Mercury Porosimeter produced by Shimazu Seisakusho Co., Ltd. The dielectric layer having a low void volume provided high durability. A dielectric layer having voids whose volume is low is, for example, a thermally sprayed ceramic layer with high density and high adhesion prepared according to an atmospheric plasma method as described later. In order to further reduce the void volume, a sealing treatment is preferably carried out.

The atmospheric plasma spraying method refers to a technique in which fine particles or wires of ceramic etc. are introduced into a source of plasma heat to form a melted or semi-melted particles, and the resulting particles are sprayed to a metal base material on which a layer is to be formed. The source of plasma heat herein referred to is a high temperature plasma gas obtained by heating gas molecules to high temperature to dissociate into atoms and applying further energy thereto to release electrons. The spraying speed of this plasma gas is high, and therefore the sprayed gas colloids the metal base material with a spray speed higher than that of a conventional arc spraying or a flame spraying, providing a layer with high adhesion and higher density. A spraying method disclosed in JP-A No. 2000-301655 can be referred to in which a heat shielding layer is formed on material heated to high temperature. The method described above can form a dielectric layer (thermally sprayed ceramic layer) having the void volume as described above.

Another preferred embodiment of the dielectric coated electrodes of the present invention capable of resisting high power is a dielectric coated electrode in which the dielectric layer has a thickness of from 0.5 to 2 mm. The variation of the dielectric layer thickness is preferably not more than 5%, more preferably not more than 3%, and still more preferably not more than 1%.

In order to further reduce the void volume of the dielectric layer, it is preferred that a thermally sprayed layer such as the thermally sprayed ceramic layer is subjected to sealing treatment employing an inorganic compound. The inorganic compound is preferably a metal oxide, and more preferably one containing a silicon oxide ($SiO_x$) as a main component.

The inorganic compound for sealing is preferably one being hardened through sol-gel reaction. When an inorganic compound for sealing is a compound containing a metal oxide as a main component, a metal alkoxide is coated on the ceramic spray layer as a sealing solution, and hardened through sol gel reaction. When the inorganic compound for sealing is a compound containing silica as a main component, an alkoxysilane is preferably used as a sealing solution.

In order to accelerate the sol gel reaction, energy treatment is preferably carried out. Examples of the energy treatment include heat hardening (hardening at not more than 200° C.) or UV irradiation. A sealing method, in which the alternate coating and hardening of diluted sealing solution are repeated several times, provides an electrode with improved inorganic property, with high density and without any deterioration.

When in the preparation of the dielectric coated electrode of the present invention, a metal oxide solution as a sealing solution is coated on a thermally sprayed ceramic layer and subjected to sealing treatment in which hardening is carried out through sol gel reaction, the metal oxide content after hardening is preferably not less than 60 mol %. When an alkoxysilane is used as a metal alkoxide of a sealing solution, the content of SiOx (x: not more than 2) after hardening is preferably not less than 60 mol %. The content of SiOx (x: not more than 2) after hardening is measured analyzing the section of the dielectric layer through an XPS (X-ray photoelectron spectroscopy).

In the electrode used in the layer formation method of the present invention, the surface of the electrode on the side contacting a substrate preferably has a maximum surface roughness Rmax (defined according to JIS B 0601) of not more than 10 µm, in obtaining the effects disclosed in the present invention. The maximum surface roughness Rmax is more preferably not more than 8 µm, and still more preferably not more than 7 µm. The electrode is surface finished by polishing treatment so as to obtain such a maximum surface roughness Rmax as described above, which makes it possible to maintain the dielectric layer thickness or a gap between the electrodes constant, provide stable discharge, and provide an electrode with greatly increased durability, with high precision and without strain or cracking due to thermal shrinkage difference or residual stress. It is preferred that at least the surface of the dielectric layer on the side contacting the substrate is surface finished by polishing. Further, the surface of the electrode has a center line average surface roughness Ra (also defined according to JIS B 0601) of preferably not more than 0.5 µm, and more preferably not more than 0.1 µm.

Another preferred embodiment of the dielectric coated electrodes used in the present invention capable of resisting high electric power is one having a heat resistant temperature of not less than 100° C., preferably not less than 120° C., and more preferably not less than 150° C. The upper limit of the heat resistant temperature is 500° C. The heat resistant temperature herein refers to a highest temperature capable of carrying out normal discharge without causing dielectric breakdown at the voltage used in the atmospheric pressure plasma processing. The above heat resistant temperature can be attained by employing a dielectric layer formed according to the thermal spray of ceramic as described above, by employing a dielectric layer comprised of two or more layers, which differ in foam content, formed according to the glass-lining as described above, or by properly selecting above mentioned conductive metal base materials and dielectrics in which the difference in linear thermal expansion coefficient between the conductive base materials and dielectrics falls within the range as described above.

Gas supplied to a discharge space will be explained below.

<Gas 1>

Gas 1 contains at least a discharge gas and a film forming gas. The discharge gas and the film forming gas may be supplied separately or as an admixture thereof.

The discharge gas is a gas capable of inducing glow discharge which enables layer formation. Examples of the discharge gas include a nitrogen gas, a rare gas, air, a hydrogen gas, and an oxygen gas, and these may be used alone or in combination. In the present invention, the discharge gas is preferably a nitrogen gas in view of the production cost. The discharge gas is preferably a gas containing 50 to 100% by volume of a nitrogen gas based on the volume of the discharge gas. It is preferred that the discharge gas contains less than 50% by volume of a rare gas as a gas other than a nitrogen gas. The discharge gas content based on the total gas supplied to the discharge space is preferably from 90 to 99.9% by volume.

Further, gas 1 preferably contains a reducing gas, examples of which include hydrogen and ammonium. Of these, specifically preferable is hydrogen. The amount of the reducing gas is preferably 0.01 to 10.0% by volume based on the total volume of the gas supplied in the discharge space.

The film forming gas is a material which is excited to form activated species and is chemically piled on the substrate to form a film on the substrate.

The film forming gases used in the present invention include an organometallic compound, a metal halide compound, and a metal hydride compound.

Example of a metal contained in the organometallic compound, the metal halide, and the metal hydride include: Li, Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Cd, In, Ir, Sn, Sb, Cs, Ba, La, Hf, Ta, W, Tl, Pb, Bi, Ce, Pr, Nd, Pm, Eu, Gd, Tb, Dy, Ho, Er, Tm, Yb and Lu.

The organometallic compound used in the present invention is preferably a compound represented by the following Formula (I):

$$R^1xMR^2yR^3z \qquad \text{Formula (I)}$$

wherein M represents a metal above mentioned; $R^1$ represents an alkyl group; $R^2$ represents an alkoxy group; $R^3$ represents a group selected from the group consisting of a β-diketone complex group, a β-ketocarboxylic acid ester complex group, a β-ketocarboxylic acid complex group, and a ketoxy (ketoxy complex) group; and when a valence of metal M is represented by m, x+y+z=m, x=0 to m or x=0 to m−1, y=0 to m, z=0 to m and x, y and z independently represent 0 or an positive integer. Examples of alkyl group of $R^1$ include a methyl group, an ethyl group, a propyl group, and a butyl group. Examples of the alkoxy group of $R^2$ include a methoxy group, an ethoxy group, a propoxy group, a butoxy group, and 3,3,3-trifluoropropoxy group. A hydrogen atom of the alkyl group may be substituted with a fluorine atom. Examples of a group of $R^3$ selected from the group consisting of a β-diketone complex group, a β-ketocarboxylic acid ester complex group, a β-ketocarboxylic acid complex group, and a ketoxy (ketoxy complex) group include 2,4-pentanedione (called acetylacetone or acetoacetone, also), 1,1,1,5,5,5-hexamethyl-2,4-pentanedione, 2,2,6,6-tetramethyl-3,5-heptanedione, and 1,1,1-trifluoro-2,4-pentanedione. Examples of a β-ketocarboxylic acid ester complex group include acetoacetic acid methyl ester, acetoacetic acid ethyl ester, acetoacetic acid propyl ester, trimethylacetoacetic acid ethyl and trifluoroacetoacetic acid methyl ester. Examples of β-ketocarboxylic acid include acetoacetic acid and trimethylacetoacetic acid. Examples of the ketoxy include an acetoxy group, a propionyloxy group, a butyloxy group, a acryloyloxy group and a methacroyloxy group. The total carbon atom number of these groups in the organometallic compound is preferably not more than 18. As is exemplified above, these groups may be straight chained or branched, or the hydrogen atom thereof may be substituted with a fluorine atom.

The organometallic compound in the present invention is preferably a less explosive compound in view of its handling. The organometallic compound in the present invention is preferably an organometallic compound having one or more oxygen atoms in the molecule. Examples of such an organometallic compound include: an organometallic compound having at least one alkoxy group represented by $R^2$ in the molecule; or an organometallic compound having at least one selected from the group consisting of a β-diketone complex group, a β-ketocarboxylic acid ester complex group, a β-ketocarboxylis acid complex group, and a ketoxy group (a ketoxy complex group) represented by $R^3$.

In the present invention, example of a metal contained in specifically preferable metal compounds include: Si (silicon), Ti (titanium), Sn (tin), Zn (zinc), In (indium) and Al (aluminum). Among the metal compounds to be bound with these metals, organometallic compounds represented by Formula (I) are preferable.

<Gas 2>

Gas 2 to be supplied to the discharge space of the second process is necessary to contain an oxidizing gas and it preferably contain a discharge gas. By carrying out the second process of the present invention, a film having an excellent property is obtained. Examples of an oxidizing gas include oxygen, ozone, hydrogen peroxide, carbon dioxide, carbon monoxide and nitrogen dioxide. Of these, oxygen, ozone and carbon monoxide are preferable, and a gas selected from these is preferably mixed with the discharge gas. The amount of an oxidizing gas is preferably 0.0001 to 30% by volume based on the total volume of the gas, more preferably 0.001 to 15% by volume, and specifically preferably 0.01 to 10% by volume. When a transparent conductive film is formed, it is preferably not more than 5% by volume, whereby a dense and high quality film is formed.

<Functional Films and Compounds>

In the method for forming a film of the present invention, the film formation in the first process is carried out by using a gas containing a metal compound, for example, an organometallic compound, a metal halide and a metal hydride, which is preferably mixed with a discharge gas, followed by carrying out the oxidizing processing using a plasma-exited gas in the second process, whereby various high quality film are obtained. Examples of the film of the present invention are shown below, however, the present invention is not limited thereto:

Dielectric protective films: $SiO_2$, $SiO$, $Al_2O_3$, $Al_2O_3$, $Y_2O_3$;
Transparent conductive films: $In_2O_3$, $SnO_2$;
Electrochromic films: $WO_3$, $IrO_2$, $MoO_3$, $V_2O_5$;
Magnetic recording films: $\gamma$-$Fe_2O_3$, $Co$, $Fe_3O_4$, $SiO_2$, $AlO_3$;
Selectively permeable films: $In_2O_3$, $SnO_2$; and
Anti-reflection films: $SiO_2$, $TiO_2$, $SnO_2$.

The above oxidation degrees of the oxides are only examples and a relative proportion with a metal atom may be arbitrarily varied. Further, a film may contain an impurity, for example, a carbon compound, a nitrogen compound and a hydrogen compound.

<Anti-Reflection Film>

Among the films with high performance described above, an anti-reflection film (layer) or a laminated anti-reflection layers used in an anti-reflection film and a transparent conductive film will be explained in detail below.

Among the layers with high performance, the anti-reflection layers of the antireflection film contain a medium refractive index layer, a high refractive index layer, and a low refractive index layer.

In the gas material for forming the anti-reflection layer in the present invention, a titanium compound for forming a high refractive index layer, a tin compound for forming a medium refractive index layer, and a silicon compound for forming a low refractive index layer will be explained below. The antireflection film having an anti-reflection layer is obtained forming each refractive index layer on a substrate directly or through another layer. The layer formation is carried out for example, employing an atmospheric pressure plasma processing apparatus shown in FIG. 3, the medium, high and low refractive index layers being continuously formed in that order employing three of the apparatuses connected in series. This continuous film formation is suitable for film formation in the present invention in view of stabilized quality and excellent productivity. In the present invention, when an anti-stain layer is provided on the anti-reflection layer, the anti-stain layer may be formed employing another atmospheric pressure plasma processing apparatus arranged after the above three apparatuses to provide four apparatuses connected in series. Before forming the anti-reflection layer on a substrate, a hard coat layer or an anti-glare layer may be provided on the substrate, or a back coat layer may be coated on the surface of the substrate opposite to the hard coat layer or the anti-glare layer.

As the gas material for forming the anti-reflection layer of the anti-reflection film in the present invention, any compound can be used without limitation as long as it can provide a proper refractive index. In the present invention, the gas material for forming a high refractive index layer is preferably a titanium compound, the gas material for forming a medium refractive index layer is preferably a tin compound or a mixture of a titanium compound and a silicon compound (the medium refractive index layer may be a laminate of the high refractive index titanium compound layer and the low refractive index silicon compound layer), and the gas material for forming a low refractive index layer is preferably a silicon compound, a fluorine-containing compound or a mixture of silicon compound and a fluorine-containing compound. Two or more kinds of these compounds may be used in any of the layers as a layer formation gas in order to adjust refractive index in its layer.

As the tin compound used in the gas material for forming a medium refractive index layer useful for the present Invention, there are an organic tin compound, a tin hydride compound and a tin halide. Examples of the organic tin compound include dibutyldiethoxytin, butyltin tris (2,4-pentanedionato), tetraethoxytin, methyltriethoxytin, diethyldiethoxytin, triisopropylethoxytin, ethylethoxytin, methylmethoxytin, isopropylisopropoxytin, tetrabutoxytin, diethoxytin, dimethoxytin, diisopropoxytin, dibutoxytin, dibutyryloxytin, diethyltin, tetrabutyltin, tin bis(2,4-pentanedionato), ethyltin acetoacetonato, ethoxytin (2,4-pentanedionato), dimethyltin (2,4-pentanedionato), diacetomethylacetatotin, diacetoxytin, dibutoxydiacetoxytin, and diacetoxytin diacetoacetonato. Examples of the tin halide include tin dichloride and tin tetrachloride. These compounds can be preferably used in the present invention. The tin compound layer is also useful for an antistatic layer, since its surface resistivity can be reduced to not more than $10^{11}$ Ω/sq.

As the titanium compound used in the gas material for forming a high refractive index layer useful for the present invention, there are an organotitanium compound, a titanium hydride compound and a titanium halide. Examples of the organotitanium compound include triethoxytitanium, trimethoxytitanium, triisopropoxytitanium, tributoxytitanium, tetraethoxytitanium, tetraisopropoxytitanium, methyldimethoxytitanium, ethyltriethoxytitanium, methyltripropoxytitanium, triethyltitanium, triisopropyltitanium, tributyltitanium, tetraethyltitanium, tetraisopropyltitanium, tetrabutyltitanium, tetradimethylaminotitanium, dimethyltitanium di(2,4-pentanedionato), ethyltitanium tri(2,4-pentanedionato), titanium tris(2,4-pentanedionato), titanium tris (acetomethylacetato), triacetoxytitanium, dipropoxypropionyloxytitanium, dibutyryloxytitanium. Examples of the titanium hydride compound include monotitanium hydride, and dititanium hydride. Examples of the titanium halide compound include trichlorotitanium, and tetrachlorotitanium. The above compounds are preferably used in the present invention. These layer formation gases can be used as an admixture of two or more kinds thereof.

As the silicon compound used in the gas material for forming a low refractive index layer useful for the present invention, there are an organosilicon compound, a silicon hydride compound and a silicon halide. Examples of the organosilicon compound include tetraethylsilane, tetramethylsilane, tetraisopropylsilane, tetrabutylsilane, tetraethoxysilane, tetraisopropoxysilane, tetrabutoxysilane, dimethyldimethoxysilane, diethyldiethoxysilane, diethylsilane di(2,4-pentanedionato), methyltrimethoxysilane, methyltriethoxysilane, and ethyltriethoxysilane. Examples of the silicon hydride compound include silane tetrahydride and disilane hexahydride. Examples of the silicon halide compound include tetrachlorosilane, methyltrichlorosilane, and diethyldichlorosilane. Any of the above compounds are preferably used in the present invention. These layer formation gases can be used as an admixture of two or more kinds thereof. Further, a proper mixture of two or more kinds of the tin compound, titanium compound, and silicon compound can be used in order to adjust refractive index of the layer.

As the organotin compound, organosilicon compound or organotitanium compound described above, a metal hydride compound or a metal alkoxide compound is preferably used in view of handling, and the metal alkoxide compound is more preferably used, since it is not corrosive, and generates no harmful gas nor causes contamination. When the organotin compound, organosilicon compound or organotitanium compound described above is introduced into a discharge space or a space between the electrodes, the compound may be in the form of gas, liquid, or solid at ordinary temperature and ordinary pressure. When they are gas at ordinary temperature and ordinary pressure, they can be introduced in the discharge space as they are. When they are liquid or solid, they are gasified by heating, or under reduced pressure or ultrasonic wave radiation, and used. When the organotin compound, organosilicon compound or organotitanium compound gasified by heating is used, a metal alkoxide such as tetraethoxymetal or tetraisopropoxymetal, which is liquid at ordinary temperature and has a boiling point of not more than 200° C., is suitably used in order to form an anti-reflection layer. The above metal alkoxide may be diluted with another solvent to obtain a solution, and the resulting solution is gasified by a vaporizer and mixed with rare gas to obtain a mixed gas. The solvents include an organic solvent such as methanol, ethanol, n-hexane or a mixture thereof.

The content of the layer formation gas in the total gas supplied to the discharge space is preferably 0.01 to 10% by volume, and more preferably 0.01 to 1% by volume, in that a uniform layer is formed on a substrate by the discharge plasma processing.

<Refractive Index of Anti-Reflection Layer>

The medium refractive index layer can be formed by a proper combination of the organotin compound, organosilicon compound or organotitanium compound described above so as to obtain the intended refractive index.

The preferred refractive index or thickness of each layer is, for example, as follows.

In the medium refractive index tin oxide layer, the refractive index is from 1.6 to 1.8, and the thickness is from 50 to 70 nm. In the high refractive index titanium oxide layer, the refractive index is from 1.9 to 2.4, and the thickness is from 80 to 150 nm. In the low refractive index silicon oxide layer, the refractive index is from 1.3 to 1.5, and the thickness is from 80 to 120 nm.

<Transparent Conductive Film>

Another example of the layer in the present invention with high performance is a transparent conductive layer, and its formation will be explained below.

In the transparent conductive layer formation, a little different metal from that used in the anti-reflection layer described above is used, in which the metal component in the organometallic compound for layer formation is a metal such as indium which is transparent and conductive, but substantially the same organic group as contained in the organometallic compound as in the anti-reflection layer.

The metal contained in the organometallic compound for the transparent conductive layer formation is preferably at least one metal selected from the group consisting of indium (In), zinc (Zn) and tin (Sn).

Examples of the transparent conductive layer in the present invention include a layer of an oxide such as $SnO_2$, $In_2O_3$, or ZnO, and a layer of a complex oxide, which is doped with a dopant, such as $SnO_2$ doped with Sb, $SnO_2$ doped with F, ZnO doped with Al, or $In_2O_3$ doped with Sn (ITO). The transparent conductive layer is preferably an amorphous layer containing as a main component at least one selected from the group consisting of these oxides.

In the present invention, preferred examples of the preferred organometallic compound include indium tris(2,4-pentanedionate), indium tris(hexafluoropentanedionate), indium triacetoacetate, triacetoxyindium, diethoxyacetoxyindium, triisopropoxyindium, diethoxyindium (1,1,1-trifluoropentanedionate), tris(2,2,6,6-tetramethyl-3,5-heptanedionato)indium, ethoxyindium bis(acetomethylacetate), di-n-butyltin bis(2,4-pentanedionato), di-n-butyldiacetoxytin, di-t-butyldiacetoxytin, tetraisopropoxytin, tetra-i-butoxytin, and bis(acetylacetonate)zinc. These organometallic compounds, manufactured by for example, Tokyo Kasei Co. Ltd., are available on the market.

<Doping>

In the present invention, the transparent conductive layer comprised of the organometallic compound, which contains at least one oxygen atom in the molecule, is preferably doped in order to increase its conductivity. Herein, a mixed gas of an organometallic compound gas for layer formation and an organometallic compound gas for doping is preferably used. Examples of the organometallic compound or a fluorine-containing compound for doping include isopropoxyaluminum, tris(2,4-pentanedionato)nickel, bis(2,4-pentanedionato)manganese, isopropoxyboron, tri-n-butoxyantimony, tri-n-butylantimony, di-n-butylbis(2,4-pentanedionato)tin, di-n-butyldiacetoxytin, di-t-butyldiacetoxytin, tetraisopropxytin, tetrabutopxytin, tetrabutyltin, zinc di(2,4-pentanedionate), hexafluoropropylene, octafluorocyclobutane, and carbon tetrafluoride.

The amount ratio of the organometallic compound gas necessary to form the transparent conductive layer to the above layer formation gas for doping differs due to the kinds of the transparent conductive layer. For example, when an ITO layer comprised of indium oxide doped with tin is formed, it is necessary that the layer formation gas used be adjusted so that an atomic ratio In/Sn of the ITO layer falls within the range of from 100/0.1 to 100/15. The ratio In/Sn of the ITO layer is preferably from 100/0.5 to 100/10. When a transparent conductive layer (hereinafter referred to as FTO layer) comprised of tin oxide doped with fluorine is formed, the layer formation gas used is preferably adjusted so that an atomic ratio Sn/F of the FTO layer falls within the range of from 100/0.01 to 100/50. When an $In_2O_3$—ZnO amorphous transparent conductive layer is formed, the layer formation gas used is preferably adjusted so that an atomic ratio In/Zn of the formed layer falls within the range of from 100/50 to 100/5. The atomic ratio, In/Sn, Sn/F or In/Zn is obtained by measurement according to XSP.

In the present invention, the content of the gas for the transparent conductive layer in the mixed gas is preferably from 0.01 to 10% by volume.

<Substrate>

The substrate used in the present invention will be explained below. The substrate in the present invention is not specifically limited, and a plane shaped one in the form of plate, sheet or film or a solid one in the form of lens or another molding can be used as long as a layer can be formed on it. Further, shape or material of the substrate is not limited, as long as the substrate is exposed to a mixed gas in the plasma state whether it is still or moves to form a uniform layer in the present invention on it. The substrate in the present invention may be flat or solid. Examples of the flat one include a glass plate or a resin plate. Examples of the material for the substrate include glass, resin, ceramic, metal, and non-metal. Examples of the glass substrate include a glass plate and lens, and examples of the resin substrate include a resin lens, a resin film, a resin sheet, and a resin plate.

Since the resin film can be transported to a space between the electrodes or the vicinity of the electrodes in the atmospheric pressure plasma processing apparatus in the present invention to continuously form a transparent conductive layer, it is suitable for a large-scale production or continuous production process which results in high productivity, the process being not a batch process, for example, carrying out sputtering out under vacuum.

Materials of resin film, resin sheet, resin lens, or resin molding include cellulose ester such as cellulose triacetate, cellulose diacetate, cellulose acetate propionate, or cellulose acetate butyrate; polyester such as polyethylene terephthalate or polyethylene naphthalate; polyolefin such as polyethylene or polypropylene; polyvinylidene chloride; polyvinyl chloride; polyvinyl alcohol; ethylene-vinyl alcohol copolymer; syndiotactic polystyrene; polycarbonate; norbornene resin; polymethylpentene; polyetherketone; polyimide; polyether sulfone; polysulfone; polyether imide; polyamide; fluorine-containing resin; polymethyl acrylate; and acrylate copolymers.

These may be used singly or as an admixture of two or more thereof. Zeonex or Zeonor (produced by Nippon Zeon Co., Ltd., an amorphous cyclopolyolefin film ARTON (produced by Nippon Synthetic Rubber Co., Ltd.), a polycarbonate film Pureace (produced by Teijin Co., Ltd.), and a cellulose triacetate film KONICATAC KC4UX, KC8UX (produced by Konica Corporation), which are available on the market, are preferably used. Further, even materials with high birefringence such as polycarbonate, polyarylate, polysulfone and polyethersulfone can be used if in their film formation, solution casting or melt extrusion conditions or stretching conditions in the transverse or mechanical direction are properly selected.

Among these, a cellulose ester film, which is optically isotropic, is preferably used in the optical element in the present invention. As the cellulose ester film, a cellulose triacetate film or a cellulose acetate propionate is preferably used. As the cellulose triacetate film, KONICATAC KC4UX available on the market is preferred.

A substrate, in which gelatin, polyvinyl alcohol, acryl resin, polyester resin, or cellulose ester resin is coated on the resin film described above, can be used. In the resin film on which the layer in the present invention is formed, an anti-glare layer, a clear hard coat layer, a barrier layer, or an anti-stain layer may be provided on the side of the layer in the present invention. Further, an adhesion layer, an alkali barrier coat layer, a gas barrier layer or a solvent resistant layer may be optionally provided on the resin film.

The substrate in the present invention is not limited to the above. The thickness of the substrate in the present invention, which is, for example, film-shaped, is preferably from 10 to 1000 μm, and more preferably from 40 to 200 μm.

The atmospheric pressure plasma processing apparatus will now be described with reference to drawings.

FIG. 1 is a schematic view showing one example of the structure of the plate electrode type atmospheric pressure plasma processing apparatus of the preset invention. In the first process (the region surrounded by the alternate long and short dash line, which is designated as P1 and this notation is also applied in the following paragraphs), facing electrodes (a discharge space) are formed by a movable platform electrode 8 (a first electrode) as well as a square-shaped electrode 7 (a second electrode) between which a high frequency electric field is applied. Subsequently, gas 1 incorporating discharge gas 11 and film forming gas 12 is fed through gas feeding pipe 15, and is blown into a discharge space through slit 5 formed by the square-shaped electrode 7. Then, gas 1 is excited by plasma discharge, and the surface of substrate placed on movable platform electrode 8 is exposed to excited gas 1, whereby a film is formed on the surface of the above substrate. All the high frequency electric fields generated in the first process are designated as high frequency electric field A.

Subsequently, substrate 4 is gradually conveyed to the second process (in FIG. 1, the region surrounded by the alternate long and two-short dash line, which is designated as P2, and this notation is also applied in the following paragraphs), along with movable platform electrode 8. In FIG. 1, the first electrode in the first process and the third electrode in the second process are integrated as a common electrode, while the first power source in the first process and the third power source in the second process are integrated as a common power source.

In the second process, facing electrodes (forming a discharge space) are formed employing a movable platform electrode 8 (being a third electrode) as well as a square-shaped electrode 3 (being a fourth electrode), and a high frequency electric field is applied to the space between the above facing electrodes. Subsequently, gas 2 incorporating discharge gas 13 and oxidizing gas 14 is fed through gas feeding pipe 16, and is blown into the discharge space through slit 6 formed by square-shaped electrode 3. Then, gas 2 (being 38 in FIG. 1) is excited by plasma discharge, and the surface of substrate 4 placed on movable platform electrode 8 is exposed to excited gas 2, whereby the film is subjected to an oxidation process. Movable platform electrode 8 incorporates a conveying means (not shown) capable of conveying supporting stand 9 at a constant rate, and capable of stopping the same. All the high frequency electric fields generated in the second process are designated as high frequency electric field B.

Further, in order to control the temperature of gas 2, it is preferable that temperature controlling means 17 is provided on the way of feeding pipe 16.

Via reciprocating movement between film formation in the first process and the oxidizing process of the second process employing a movable platform, it is possible to form a film of a desired film thickness.

First electrode 8 (being the movable platform electrode) is connected to first power source 31, while second electrode 7 is connected to second power source 33. Further, each of first filter 32 and second filter 34 is connected to the line between its electrode and power source. Filters are employed which are to provide each of functions such that first filter 32 retards the passage of electric current at a specific frequency from power source 31, and enhances the passage of electric current at a frequency from second power source 33, while second filter 34 retards the passage of electric current at a specific frequency from second power source 33 and enhances the passage of electric current at a specific frequency from first power source 31.

In the first process of the atmospheric pressure plasma processing apparatus in FIG. 1, a space is formed between first electrode 8 and second electrode 7 facing each other, and applied to the space are: a first high frequency electric field having a frequency of $\omega 1$, an electric field strength of V1, and an electric current of I1, which is supplied from first power source 31 through first electrode 8; and a second high frequency electric field having a frequency of $\omega 2$, an electric field strength of V2 and an electric current of I2, which is supplied from second power source 33 through second electrode 7. First power source 31 is capable of supplying a high frequency electric field strength which is higher than that of second power source 33 (V1>V2) while capable of supplying a frequency of $\omega 1$ of first power source 8 which is lower than second frequency $\omega 2$ of second power source 33.

In the second process, in the same manner, a space is formed between third electrode 8 which is common as the first electrode and second electrode 7 facing each other, and applied to the space are: a first high frequency electric field having a frequency of $\omega 1$, an electric field strength of V1, and an electric current of I1, which is supplied from first power source 31 through first electrode 8; and a fourth high frequency electric field having a frequency of $\omega 4$, an electric field strength of V4 and an electric current of I4, which is supplied from fourth power source 35 through fourth electrode 3.

First power source 31 is capable of supplying a high frequency electric field strength which is higher than that of fourth power source 35 (V1>V4) while capable of supplying a frequency of $\omega 1$ of first power source 8 which is lower than fourth frequency $\omega 4$ of fourth power source 35.

Further, in FIG. 1, shown are measurement instruments which are used to determine the aforesaid high frequency electric field (being applied electric field strength) as well as the strength of a discharge initiation electric field. Numerals 25 and 26 are high frequency voltage probes, while numerals 27 and 28 are oscilloscopes.

As noted above, by applying two high frequency voltages, which differ in frequency, to square-shaped electrode 7 and movable platform electrode 8 which are facing each other, it is possible to achieve preferable plasma discharge even using less expensive gasses, such as nitrogen. Thereafter, by quickly performing the processing under an oxidizing atmosphere, it is possible to form films which exhibit excellent performance. Incidentally, the present apparatus is suitable for forming a film, employing a plate substrate such as glass, and is particularly suitable for forming a transparent conducive film which exhibits high conductivity and allows easy etching.

Figure 2:
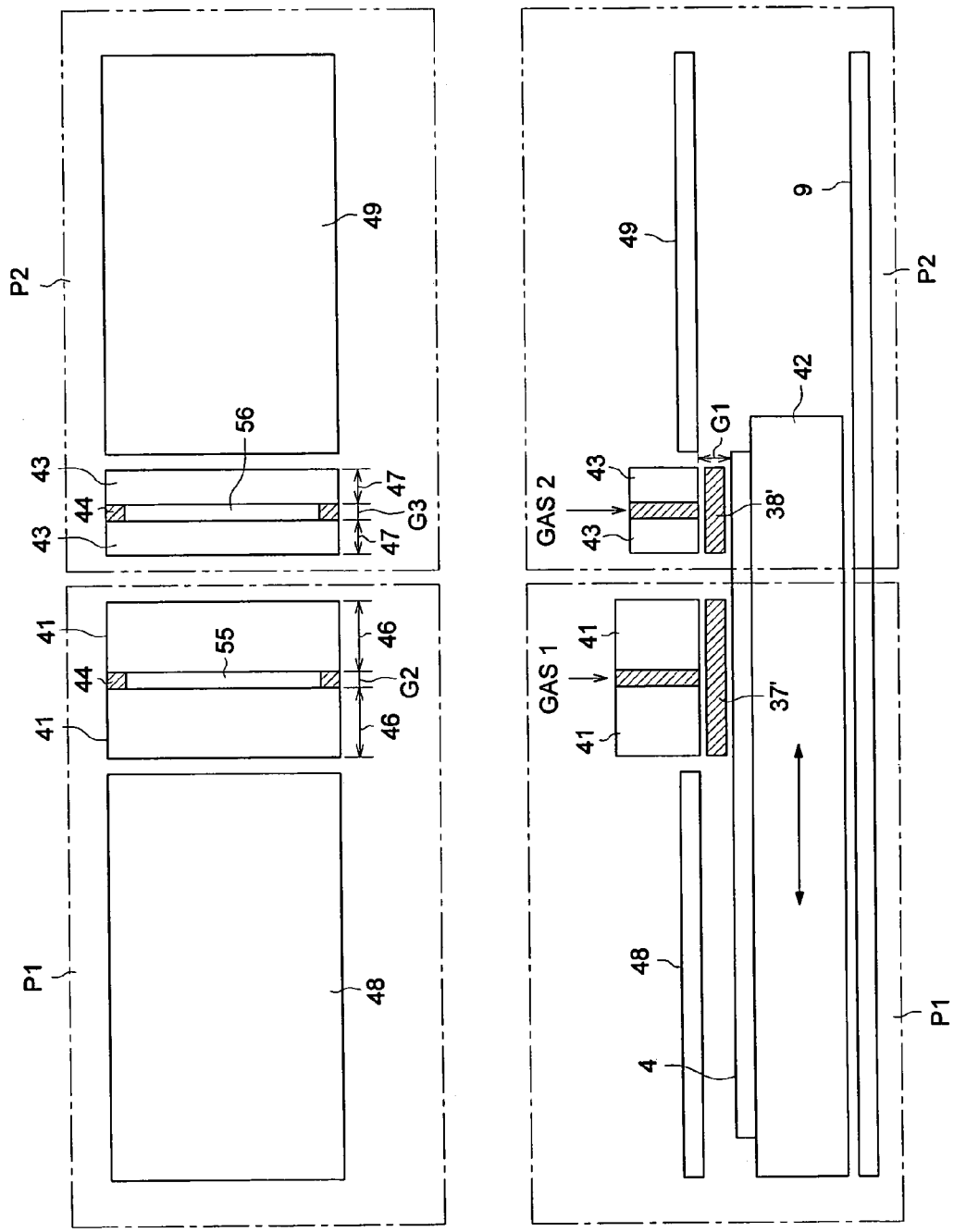
FIG. 2(a) is a schematic construction diagram illustrating a plan view of a film forming apparatus having blocking plates preferably used in the present invention.
FIG. 2(b) is a schematic construction diagram illustrating a front view of a film forming apparatus having blocking plates preferably used in the present invention.

In the present invention, during formation of transparent conductive films, it is more preferable to use a film forming apparatus equipped with shielding blades as shown in FIG. 2. FIG. 2(*a*) is a plan view of the film forming apparatus, while FIG. 2(*b*) is a front view of the same. In the first process, facing electrodes are formed employing square-shaped electrode 41 (being a second electrode), in which gas passage slit 55 is formed at the center employing two electrode plates and two space materials 44 as well as movable platform electrode 42 (being a first electrode). Gas 1 fed from the feeding pipe is blown into the discharge space from the outlet of slit 55 and is excited employing plasma in the discharge space formed in the gap between the bottom surface of square-shaped electrode 41 (being the second electrode) and movable platform electrode 42 (being the first electrode). Substrate 4 on movable platform electrode 42 is exposed to excited gas 1 (37' in FIG. 2), whereby a film is formed. Movable platform electrode 42 while carrying substrate 4 is gradually conveyed and the film formed on substrate 4 is conveyed to the second process. Gas 2 fed from an oxidizing gas feeding pipe is excited in a discharge space in the same manner as above and the film formed in the first process is exposed to gas 2 (in FIG. 2, 38'). In the above apparatus, shielding blades 48 and 49 are provided on both sides of square-shaped electrodes 41 and 43. During preparation of a transparent conductive film, the oxidizing environment of the second process only requires an extremely small amount of oxygen. Atmospheric air incorporates an excessively large amount of oxygen. Consequently, the above apparatus is suitable to feed oxygen at a controlled concentration to the surface of substrate while retarding the effects of the ambient atmosphere.

It is preferable that the thickness of an accumulated film per operation in the first process is preferably not more than 10 nm, and the first process and the second process are repeated several times. The thickness of the resulting film is preferably not less than 50 nm and not more than 1 µm.

When the film formed on a substrate is applied to the electrode of various display elements as a transparent conductive film, a patterning process is essential, which draws circuits on a substrate, and further, in terms of process adaptability, important concerns are whether the above patterning is easily performed or not. In many cases, the pattering is performed employing photolithography. Portions, which do not require conduction, are removed by dissolution employing etching. Therefore, the essential requirements include a high dissolution rate and the formation of no residues. The transparent conductive film prepared employing the film production method of the present invention results in highly preferable etching properties.

Figure 3:
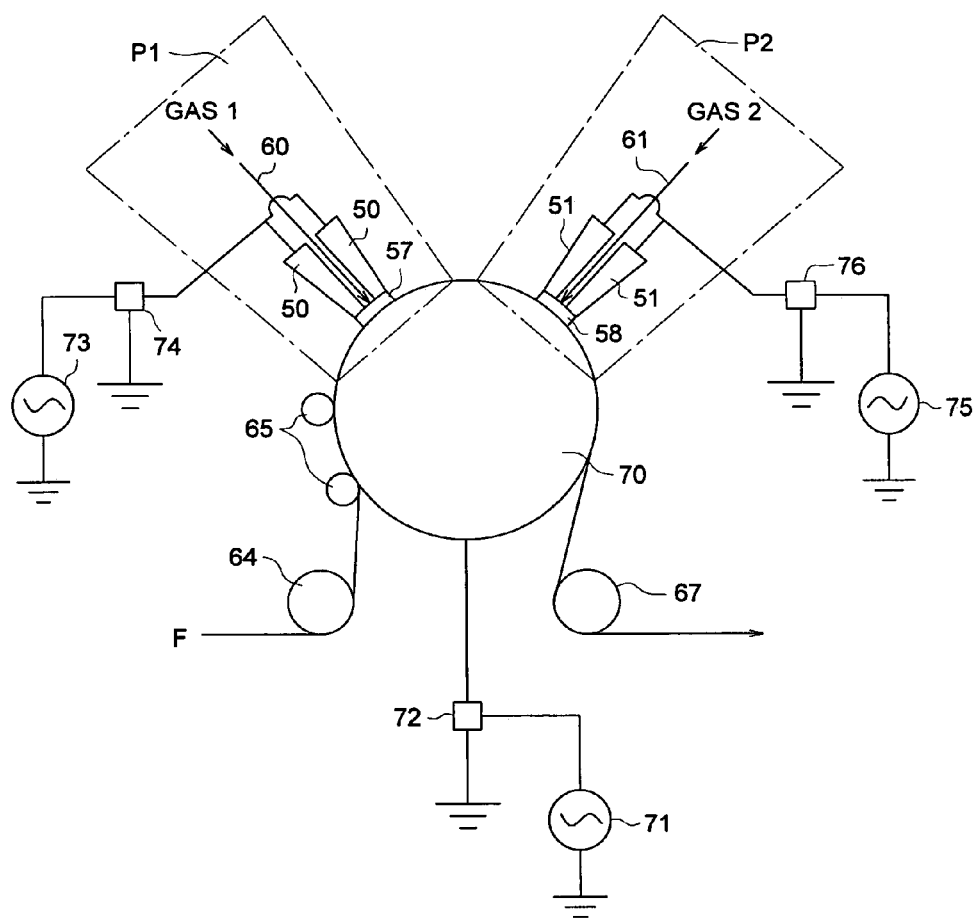
FIG. 3 is a is a schematic construction diagram illustrating an example of a rolling electrode-atmospheric pressure plasma processing apparatus used in the present invention.

FIG. 3 is a schematic view showing one example of a roller rotating electrode type atmospheric pressure plasma processing apparatus useful for the present invention.

The atmospheric pressure plasma processing apparatus is structured in such a manner that a plasma generating first process section which forms a film, and a second process section, in which oxidizing gases are subjected to plasma excitation, are arranged in series in the rotation direction of roller rotating electrode 70 (being a first electrode), and further structured in such a manner that the first electrode of the first process and the third electrode of the second process are employed as a common roller electrode.

Further, the structure is as follows. Gas 1 is fed from gas feeding pipe 60 to the space (being the discharge space) between facing electrodes composed of roller rotating electrode 70 (being the first electrode) and square-shaped electrode 50 (being the second electrode), and the above gas 1 is excited by plasma discharge to form a film on substrate F. In addition, oxidizing gas 2 is fed from gas feeding pipe 61 to the space (being the discharge space) between the roller rotating electrode 70 (the third electrode and the first electrode are used in common) and square-shaped electrodes 51 (being the fourth electrode), and above gas 2 is excited by plasma discharge so that the surface of the film formed in the first process is subjected to an oxidation processing.

The first high frequency electric field of a frequency of $\omega 1$, an electric field strength of V1, and a current of I1 from first power source 71 is applied by roller rotating electrode 70 (being the first electrode) of the first process, while the second high frequency electric field of a frequency of $\omega 2$, an electric field strength of V2, and a current of I2 from second power source 73 is applied by square-shaped electrode 50 (being the second electrode).

The apparatus is designed as follows. First filter 72 is arranged between roller rotating electrode 70 (being the first electrode) and first power source 71. First filter 72 allows the electric current to be easily transmitted from first power source 71 to first electrode 70, and the electric current from second power source 73 is grounded, whereby the electric current is prevented to be transmitted from second power source 73 to first power source 71. Further, second filter 74 is arranged between square-shaped electrode 50 (being the second electrode) and second power source 73. Second filter 74 allows the electric current to be easily transmitted from second power source 73 to second electrode 50, and the electric current from first electrode 71 is grounded, whereby the electric current is prevented to be transmitted from first power source 71 to second power source 73.

Further, the second process is arranged as follows. A discharge space (between counter electrodes) is formed between roller rotating electrode 70 (the third electrode is common to the first electrode) by which the third high frequency electric field of a frequency of $\omega 3$, an electric field strength of V3, and an electric current of I3 from the thirds power source (being common to the first electrode) is applied, and square-shaped electrode 51 (being the fourth electrode) by which the high frequency electric field of a frequency of $\omega 4$, an electric field strength of V4 and an electric current of I4 from fourth power source 75 is applied.

Substrate F, which is fed from a master roll, not shown, while being unwound, or conveyed from the prior process, passes over guide roller 64 and nip roller 65, where nip roller 65 blocks air accompanying the substrate. Thereafter, while brought into contact with roller rotating electrode 70, it is conveyed to the gap of square-shaped electrode 50 while being wound, and plasma is generated in the space (being the discharge space) between roller rotating electrode 70 (being the first electrode) and square-shaped electrode 50 (being the second electrode). While brought into contact with roller rotating electrode 70, substrate F is wound and gas 1 is excited by plasma, whereby a film is formed on substrate F employing excited gas 1 (57 in FIG. 3). Subsequently, resulting substrate F is conveyed to the second process, and gas 2 incorporating oxidizing gases is excited and an oxidation process is performed in such a manner that the surface on the film is exposed to excited gas 2 (58 in FIG. 3). Thereafter, resulting substrate F is discharged via guide roller 67.

During formation of the films, in order to heat or cool roller rotating electrode 70 (being the first electrode), as well as square-shaped electrodes 50 (being the second electrode) and 51 (being the fourth electrode), it is preferable that the medium of which the temperature is controlled employing an electrode temperature controlling device (not shown) is fed to both electrodes, employing a liquid feeding pump, and temperature is controlled from the interior of the electrodes.

Discharged substrate F is wound or conveyed to the next process. Wound substrate F may be repeatedly subjected to the same process as above.

Figure 4:
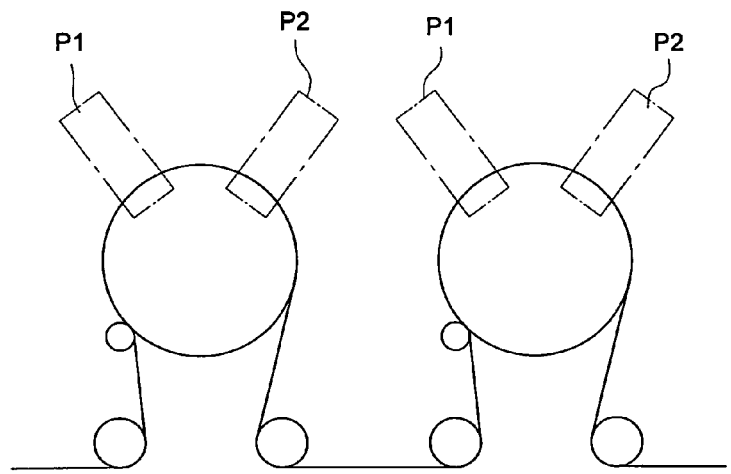
FIG. 4 is a schematic diagram illustrating an atmospheric pressure plasma processing apparatus in which two sets of rolling electrode-atmospheric pressure plasma processing apparatuses are placed in series.

Further, FIG. 4 shows an atmospheric pressure plasma processing apparatus which is constituted in such a manner that two roller rotating electrode type processing apparatuses are arranged in series. By employing the above apparatus, substrate F is capable of being subjected to two-stage processing, and also multi-stage processing upon increasing the number of stages. Alternatively, a multilayered film may be formed while changing processing conditions in each of the processing apparatuses.

The above roller rotating electrode type plasma processing apparatus is suitable to form a film employing a film substrate and is capable of forming various films described above. Particularly, it is suitable for the formation of transparent conductive films, as well as anti-reflection films, anti-glare films and insulation films, employing organic metal compounds capable of achieving relative high thickness.

Figure 5:
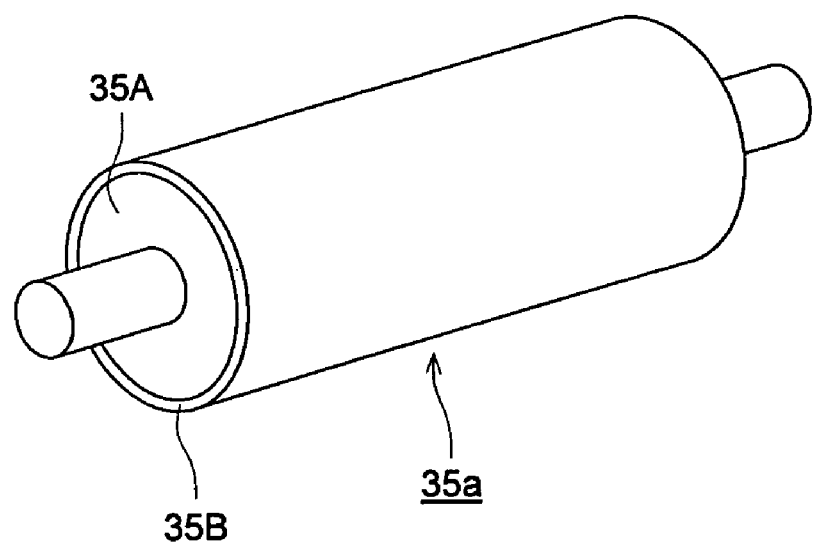
FIG. 5 is a perspective figure illustrating an example of a structure of a rolling electrode having a conductive metal base material covered with a dielectric layer.

FIG. 5 is a perspective view showing one example of the structure of the metallic base material of the roller rotating electrode shown in FIG. 3 and the dialectic covering thereon.

In FIG. 5, roller electrode 35*a* is composed of conducting metallic base material 35A having thereon dielectric 35B. In order to control the temperature of the electrode surface during plasma discharge processing, the structure is such that it is possible to circulate temperature-controlling media (such as water or silicone oil).

Figure 6:
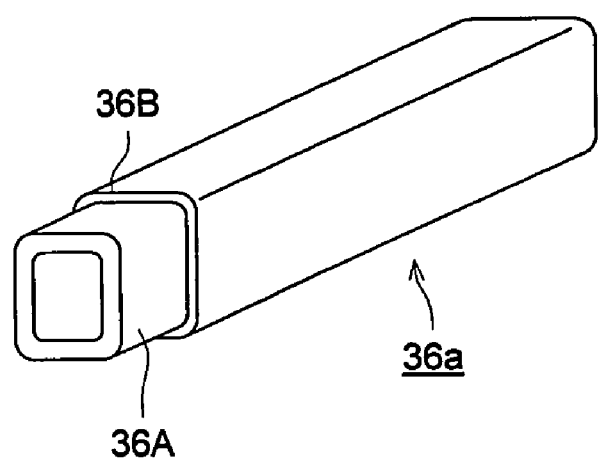
FIG. 6 is a perspective figure illustrating an example of a structure of a prismatic electrode having a conductive metal base material covered with a dielectric layer.

FIG. 6 is a perspective view showing one example of the structure of conductive metallic base material of the movable platform electrode and the square-shaped electrode in FIGS. 1-3, and the dielectric covering thereon.

In FIG. 6, square-shaped electrode 36 is composed of conductive metallic base material 36A having thereon a dielectric 36B covering in the same manner as FIG. 5, and the above electrode is structured to form a square metallic pipe which works as a jacket, making it possible to control the temperature during discharging.

In FIGS. 5 and 6, roller electrode 35*a* and square-shaped electrode 36*a* are prepared in the following manner. Ceramics as dielectrics 35B and 36B are subjected to flame coating onto conductive metallic base materials 35A and 36B, respectively, and thereafter, a sealing treatment is performed employing inorganic sealing materials. The coverage thickness of the ceramic dielectrics may be approximately 1 mm on one side. Preferably employed as ceramic materials used for flame coating are alumina and silicon nitride. Of these, particularly and preferably employed is alumina. Further, the above dielectric film may be composed of lining-processed dielectrics in which inorganic materials are arranged via a lining.

FIG. 7 shows an example of an apparatus in which during a process, a discharge gas is fed to a discharge space and the excited discharge gas is brought into contact with a film forming gas. The name of each of the sections is described below.

701 substrate
702a and 702b applied electrode
703a, 703b, and 707 base metal
704a, 704b, and 706 dielectric
705 grounding electrode
708 high frequency power source
709 earth
710 gas inletting section
711 film forming gas passage
712a and 712b discharge gas passage
713a and 713b temperature maintenance controlling system
714a and 714b film forming gas passage wall
715a and 715b discharge gas passage wall

EXAMPLES

The present invention will now be detailed with reference to examples; however, this invention is not limited thereto.

Example 1

Preparation of Sample 11: Present Invention

The atmospheric pressure plasma processing apparatus, shown in FIG. 1, was employed and a transparent conductive film was formed at a thickness of 100 nm, employing a non-alkali glass (CORNING 7059 at a thickness of 0.5 mm, produced by Corning, Inc.) as a substrate, according to the method described below.

Herein, the movable platform electrode as a first electrode and the square-shaped electrodes as a second and fourth electrodes were prepared in such a manner that a hollow square-shaped titanium pipe was subjected to flame coating employing ceramic as a dielectric to result in a converge thickness of 1 mm on one side.

Conditions of each process are described below, wherein ω represents the frequency of an electric field, V represents the electric field strength, and I represents the electric current, and the numeric values following each of them represents the argument of each electric field, while IV represents the strength of the initiating discharge electric field, and the numeric values following each of them represents the argument of the process.

(First Process: Film Forming Process)

(Power Source Conditions)

Superposed Power Source:

First Power Source (Impulse High Frequency Power Source, Available from Heiden Laboratory):
  $\omega_1$: 100 kHz, V1: 6 kV, I1: 8 mA/cm$^2$, output density: 16 W/cm$^2$ Second Power Source (High Frequency Power Source, Produced by Pearl Kogyo Co., Ltd.):
  $\omega_2$: 13.56 kHz, V2: 750 V, I2: 150 mA, and output density: 11 W/cm$^2$
  IV1: 3.5 kV Gap between the electrodes: 1.5 mm (Conditions of Gas 1)
  $N_2$ gas for vaporizing In acetylacetonate: 10 L/minute, 170° C.
  $N_2$ gas for vaporizing dibutyl tin diacetonate: 1.0 L/minute, 170° C.
  Discharge gas $N_2$: 40 L/minute
  Reducing gas $H_2$: 1.0 L/minute (Second Process: Oxidation Process)

(Power Source Conditions)

Superposed Power Source:

Third Power Source (being Common with the First Power Source)
  $\omega_3$: 100 kHz, V3: 6 kV, I3: 8 mA/cm$^2$, output density: 16 W/cm$^2$ Fourth Power Source (High Frequency Power Source, Produced by Pearl Kogyo Co., Ltd.):
  $\omega_4$: 13.56 kHz, V4: 750 V, I4: 150 mA/cm$^2$, and output density: 11 W/cm$^2$
  IV2: 3.5 kV (Conditions of Gas 2)
  Discharge gas $N_2$: 10 L/minute
  Oxidizing gas $O_2$: 0.01 L/minute
  In the case of Sample 11, a 100 nm thick film was formed employing the reciprocating process 700 time over 30 minutes.

(Preparation of Sample 12: Present Invention)
Sample 12, at a film thickness of 100 nm, was prepared under the same film forming conditions as Sample 11, except that Ar was used as a discharge gas in the first process, the reducing gas was not used, and further the second power source was only used without using the first power source, while Ar was used as a discharge gas in the second process, the fourth power source was only used without using the third power source.

(Preparation of Sample 13: Comparative Example)
Sample 13, at a film thickness of 100 nm, was prepared under the same film forming conditions as sample 11, except that gas 1 and gas 2 were blended and introduced into the first process, and only nitrogen gas was used in the second process.

(Preparation of Sample 14: Comparative Example)
Sample 14, at a film thickness of 100 nm, was prepared under the same film forming conditions as sample 13, except that conditions of the second power source were changed as follows.

Second Power Source (being a High Frequency Power Source, Produced by Pearl Kogyo Co., Ltd.):
  $\omega_2$: 13.56 MHz, V2: 1.5 kV, I2: 300 mA, output density: 22 W/cm$^2$ (Preparation of Sample 15: Present Invention)
Sample 15, at a film thickness of 100 nm, was prepared in the same manner as Sample 11, except that in the first process, after accumulating a film of 20 nm, an oxidizing processing in the second process was performed and this operation was repeated 10 times.

(Preparation of Sample 16: Present Invention)
Sample 16, at a film thickness of 100 nm, was prepared in the same manner as Sample 11, except that in the first process, after accumulating a film of 20 nm, an oxidizing processing in the second process was performed and this operation was repeated 5 times.

Each of the resulting samples was evaluated for the following items. Table 1 lists the evaluation results.

(Evaluation Items)

<<Transmittance>>

Transmittance at 550 nm was determined employing a spectrophotometer Type U-4000, produced by Hitachi, Ltd. based on to JIS-R-1635.

<<Volume Resistivity>>

Determination was performed employing the four-point probe method based on JIS-R-1637. Incidentally, ROR-ESTER GP, MCP-T600, produced by Mitsubishi Chemical Corp., was employed for determination.

<<Etching Property>>

A photolithographic photosensitive solution was applied onto the transparent conductive film of each sample, subsequently dried, subjected to pattern exposure, and to developing treatment. Thereafter, the resulting sample was subjected to an etching treatment upon being immersed into the etching solution (maintained at 30° C.) composed as described below. Each of the samples, which had been subjected to etching for 30, 45, 60, 120, and 180 seconds, was washed with water and dried. After drying, the cross-section of the boundary of the etched and non-etched portions was observed employing an electron microscope, and the degree of film removal was visually evaluated.

<Composition of Etching Solution>

Water, concentrated hydrochloric acid, and a 40 weight percent ferric chloride solution were blended at the weight ratio of 85:8:7, and the resulting solution was employed as an etching solution.

<Evaluation Criteria of Etching Patterns>

A: the transparent conductive film was capable of being removed within 30 seconds and the boundary portion of the etching pattern was considered to be excellent B: the transparent conductive film was capable of being removed within 45 seconds and the boundary portion of the etching pattern was considered to be excellent C: the transparent conductive film was capable of being removed within 60 seconds and the boundary portion of the etching pattern was considered to be excellent D: the transparent conductive film was capable of being removed within 120 seconds but the boundary portion of the etching pattern was considered to be rather poor E: some of the transparent conductive film remained even after 180 seconds and the boundary portion of the etching pattern was quite jagged F: the transparent conductive film remained in the form of islands even after 180 seconds Table 1 shows the results.

TABLE 1

| Sample No. | Transmittance (%) | Volume Resistivity ($\times 10^{-4}$ $\Omega \cdot$ cm) | Etching Property | Remarks |
|---|---|---|---|---|
| Sample 11 | 95 | 2.1 | A | Inv. |
| Sample 12 | 96 | 2.9 | B | Inv. |
| Sample 13 | 91 | 40.0 | F | Comp. |
| Sample 14 | 92 | 98.0 | F | Comp. |
| Sample 15 | 94 | 5.8 | B | Inv. |
| Sample 16 | 94 | 10 | C | Inv. |

Inv.: Present Invention
Comp.: Comparative Example

It was found that the samples of the present invention which had been subjected to an oxidizing processing after forming the film resulted in an excellent film. Data of Samples 13 and 14 showed that when films were formed in such a manner that gases 1 and 2 were blended and charged into the first process, the resulting samples exhibited undesired high volume resistivity as well as poor etching property, whereby it was not possible to prepare desired transparent conductive films. Further, when the thickness of films was increased by the extension of the first process, the resulting effects tended to be degraded, whereby it was more preferable that the accumulated thickness per operation was at most 10 nm.

Example 2

By employing the film forming apparatus fitted with the shielding blade shown in FIG. 2, preparation was performed under the same conditions as for Sample 11, and the excellent results shown below were obtained.

Transmittance: 97 percent
Volume resistivity: $1.5 \times 10^{-4}$ $\Omega \cdot$cm.
Etching property: A Example 3

By employing the roller rotating electrode type atmospheric pressure plasma processing apparatus shown in FIG. 3, a transparent conductive film was prepared in the same manner as Example 1, employing a 100 µm thick PET film in the form of a roll as a substrate.

Herein, with respect to the roller electrode, a dielectric of a thickness of 1 mm on one side was prepared by flame coating. A hollow square-shaped titanium pipe was subjected to the same treatment as above to form a square-shaped electrode. The resulting square-shaped electrode was arranged on the roller electrode to form a 1 mm gap between them. Two electrodes were arranged, one for forming a film in the first process and the other for the oxidizing processing in the second process. Further, on the roller electrode side, employed was a stainless steel jacket roller metal material exhibiting a cooling function employing cooling water. Discharge was carried out while performing heat exchange employing temperature maintained water. The roller electrode was rotated employing a motor drive mechanism.

Preparation was performed as follows. Gases 1 and 2, as well as power source conditions were the same as those for Sample 11 in Example 1. The thickness of the film formed by each pass was controlled to be 10 nm so that a 100 nm thick film was prepared after 10 passes. Besides these, the same conditions as for Sample 11 were employed.

Even by employing the apparatus equipped with the roller rotating electrode, obtained were transparent conductive films exhibiting low resistance, high transmittance, and excellent etching property as same as in Example 1. On the contrary, those which were prepared under conditions (equivalent to Samples 13 and 14 of Example 1), in which gases 1 and 2 were blended and the resulting mixture was introduced into the first process, resulted in transparent conductive films exhibiting high resistance and degraded etching property.

Example 4

Preparation of Sample 21: Present Invention

By employing the roller rotating electrode type plasma processing apparatus shown in FIG. 3, which was used in Example 3, a thin $TiO_2$ film was formed on a 100 μm thick PET film in the form of a roll.

Conditions for preparing the roller electrode and the square-shaped electrode were the same as Example 3.

In regard to the electrodes used herein, a roller electrode (being the first electrode) was connected to the high frequency power source (at 80 kHz), produced by Oyo Electric Co., Ltd., while the square-shaped electrodes (being the second and fourth electrodes) were connected to a high frequency power source (at 13.56 MHz), produced by Pearl Kogyo Co., Ltd. A film was formed under the following conditions.

The thickness of the film accumulated during one pass was controlled to be 20 nm and a film of a thickness of 100 nm was formed via 5 passes.

<<First Process: Film Forming Process>>

(Power Source Conditions)

Superposed Power Source:

First Power Source (High Frequency Power Source, Produced by Oyo Electric Co., Ltd.):
  $\omega 1$: 80 kHz, V1: 6 kV, I1: 8 $mA/cm^2$, output density: 16 $W/cm^2$ Second Power Source (High Frequency Power Source, Produced by Pearl Kogyo Co., Ltd.):
  $\omega 2$: 13.56 kHz, V2: 750 V, I2: 130 mA, and output density: 10 $W/cm^2$ IV2: 3.5 kV <Gas 1>
  Discharge gas: $N_2$
  Reducing gas: $H_2$ (3 percent with respect to the total gases
  Reactive gas: tetraisopropoxytitanium vapor 0.3 percent (vaporized into nitrogen gas employing a vaporizer, produced by Lintex Corp.)

<<Second Process: Oxidation Process>>

Superposed Power Source:

Third Power Source (being Common with the First Power Source)
  $\omega 3$: 80 kHz, V3: 6 kV, I3: 8 $mA/cm^2$, output density: 16 $W/cm^2$ Fourth Power Source (High Frequency Power Source, Produced by Pearl Kogyo Co., Ltd.):
  $\omega 4$: 13.56 kHz, V4: 800 V, I4: 180 mA, and output density: 11 $W/cm^2$ IV2: 3.5 kV <Gas 2>
  Discharge gas: $N_2$
  Oxidizing gas: $O_2$ (10 percent with respect to the total gases)
  The film forming rate at one time was set at 50 nm/second.

(Preparation of Samples 22-28)

Each of Samples 22-28 was prepared in the same manner as Sample 21, except that the oxidizing gas in the second process was replaced with each of the added gases listed in Table 2. Sample 27 was prepared in such a manner that no added gas was incorporated in the second process and only discharge gas was present, while Sample 28 was prepared in such a manner that the film was formed only employing the first process without performing the second process.

<Refractive Index: Evaluation of Film Denseness>

When denseness is degraded due to porous structures, the resulting refractive index decreases due to inclusion of air in pores. Accordingly, the degree of denseness was evaluated utilizing refractive indexes as an alternative parameter.

Refractive indexes were evaluated as follows. The spectral reflectance of the aforesaid film was determined using direct reflection at 5-degree, employing SPECTROPHOTOMETER TYPE 1U-5000 (produced by Hitachi, Ltd.). The rear surface of a film forming substrate was subjected to a roughening treatment. Thereafter, a light absorption treatment was performed employing a black spray, and while minimizing light reflection on the rear surface of films, spectral reflectance at a wavelength of 400-700 nm was determined. Optical film thickness was calculated based on the $\lambda/4$ value and refractive indexes were calculated based on the above values. Herein, the highest refractive index was accepted as the refractive index of the aforesaid film. Table 2 shows the evaluation results.

TABLE 2

| Sample No. | Presence of Second Process | Added Gas | Refractive Index | Remarks |
|---|---|---|---|---|
| Sample 21 | present | $O_2$ | 2.25 | Inv. |
| Sample 22 | present | $O_3$ | 2.25 | Inv. |
| Sample 23 | present | $CO_2$ | 2.15 | Inv. |
| Sample 24 | present | $NO_2$ | 2.20 | Inv. |
| Sample 25 | present | $H_2O$ | 2.20 | Inv. |
| Sample 26 | present | $H_2$ | 1.97 | Comp. |
| Sample 27 | present | none | 1.97 | Comp. |
| Sample 28 | absent | none | 1.95 | Comp. |

Inv.: Present Invention
Comp.: Comparative Example

Even though a film was formed at a very high rate such 50 nm/second, it was possible to form a thin high quality film. Further, when constituted according to the present invention, it was possible to achieve a high film quality at a refractive index of 2.1 or more.

Example 5

Films were formed by employing the atmospheric pressure plasma processing apparatus shown in FIG. 4, which was used in Example 4, in which two atmospheric pressure plasma apparatuses were arranged in series. Herein, employed as power source conditions were the same as those employed in Example 4, and by increasing the film conveying rate twice, the film thickness achieved by one pass per apparatus was controlled to be ½, namely 10 nm.

The refractive index of films prepared as above was 2.31, whereby the film quality was further enhanced.

The above results show that, when films at the same thickness are prepared, a film having higher quality is obtained when film thickness per operation is decreased and the repeat number of alternate film formation in the first process and oxidation in the second process is increased.

Example 6

Preparation of Samples 31 and 32

Further, the continuous atmospheric pressure plasma processing film forming apparatus employed in Example 5 were also employed, whereby a 22 nm thick $TiO_2$ film was formed employing the first apparatus, while during the second stage, a 120 nm thick $SiO_2$ film was applied onto the above film, whereby an anti-reflection film (Sample 31: the present invention) was prepared. Further, a film was formed in the same manner as Sample 31 of the present invention, except that the oxidation process, which was the second process of each of the first stage, and the second stage were eliminated, and a film was formed employing only the first process. The resulting sample was designated as Sample 32.

High temperature and high humidity resistance of the resulting anti-reflection film was evaluated as described below. Samples were allowed to stand at conditions of 80° C. and 90 percent relative humidity for 24 hours, and adhesion to the substrate was evaluated.

<Evaluation of Adhesion

Adhesion was evaluated employing a peeling test method in which the resulting film was cut at an angle of 90 degrees employing a razor blade and CELLOTAPE (registered trade name), produced by Nichiban Co., Ltd., was adhered and then peeled off at a high rate. Table 3 shows the results.

TABLE 3

| Sample No. | Presence of Second Process | Adhesion | Remarks |
| --- | --- | --- | --- |
| Sample 31 | present | good | Inv. |
| Sample 32 | absent | poor | Comp. |

Inv.: Present Invention
Comp.: Comparative Example

Samples of the present invention, which were prepared under continuous high rate film forming conditions, resulted in films which were not degraded under high temperature and high humidity.

INDUSTRIAL APPLICABILITY

According to the present invention, a high quality film is obtained at lower cost even with a high production rate.

What is claimed is:

1. A method for forming a film
comprising a first process and a second process,
the first process comprising the steps of:
(i) supplying a discharge gas containing nitrogen in an amount of 50% by volume or more based on a volume of the discharge gas, to a first discharge space of an atmospheric pressure plasma processing apparatus, the first discharge space is formed between a first electrode and a second electrode which are facing each other, where a high frequency electric field A is generated at atmospheric pressure or at approximately atmospheric pressure in the first discharge space by superposing a first high frequency electric field of 200 kHz or less and a second high frequency electric field of 800 kHz or more, the first high frequency electric field is applied to the first electrode and the second high frequency electric field applied to the second electrode, whereby the discharge gas is excited;
(ii) transferring energy of the excited discharge gas to a film forming gas, whereby the film forming gas is excited; and
(iii) exposing a substrate to the excited film forming gas, whereby a film is formed on the substrate,
the second process comprising the steps of:
(iv) supplying a gas containing an oxidizing gas to a second discharge space of the atmospheric pressure plasma processing apparatus where high frequency electric field B is generated at atmospheric pressure or at approximately atmospheric pressure, whereby the gas containing the oxidizing gas is excited; and
(v) exposing the film formed in the first process to the excited gas containing the oxidizing gas, and
moving the substrate between the first discharge space and the second discharge space.

2. A method for forming a film
comprising a first process and a second process,
the first process comprising the steps of:
(i) supplying a discharge gas containing nitrogen in an amount of 50% by volume or more based on a volume of the discharge gas, to a first discharge space of an atmospheric pressure plasma processing apparatus, the first discharge space is formed between a first electrode and a second electrode which are facing each other, where a high frequency electric field A is generated at atmospheric pressure or at approximately atmospheric pressure in the first discharge space by superposing a first high frequency electric field of 200 kHz or less and a second high frequency electric field of 800 kHz or more, the first high frequency electric field is applied to the first electrode and the second high frequency electric field applied to the second electrode, whereby the discharge gas is excited;
(ii) putting a film forming gas in contact with the excited discharge gas;
(iii) exposing a substrate to the film forming gas put in contact with the excited discharge gas, whereby a film is formed on the substrate,
the second process comprising the steps of:
(iv) supplying a gas containing an oxidizing gas to a second discharge space of the atmospheric pressure plasma processing apparatus where high frequency electric field B is generated at atmospheric pressure or at approximately atmospheric pressure, whereby the gas containing the oxidizing gas is excited; and
(v) exposing the film formed in the first process to the excited gas containing the oxidizing gas, and
moving the substrate between the first discharge space and the second discharge space.

3. A method for forming a film
comprising a first process and a second process,
the first process comprising the steps of:
(i) supplying gas 1 containing a film forming gas and a discharge gas containing nitrogen in an amount of 50% by volume or more based on a volume of the discharge gas, to a first discharge space of an atmospheric pressure plasma processing apparatus, the first discharge space is formed between a first electrode and a second electrode which are facing each other, where a high frequency electric field A is generated at atmospheric pressure or at approximately atmospheric pressure in the first discharge space by superposing a first high frequency electric field of 200 kHz or less and a second high frequency electric field of 800 kHz or more, the first high frequency electric field is applied to the first electrode and the second high frequency electric field applied to the second electrode, and whereby gas 1 is excited; and
(ii) exposing a substrate to exited gas 1, whereby a film is formed on the substrate,
the second process comprising the steps of:
(iii) supplying gas 2 containing an oxidizing gas to a second discharge space of the atmospheric pressure plasma processing apparatus where high frequency electric field B is generated at atmospheric pressure or at approximately atmospheric pressure, whereby gas 2 is excited;

(iv) exposing the film formed in the first process to excited gas 2 containing the oxidization gas, and moving the substrate between the first discharge space and the second discharge space.

4. The method of any one of claims 1 to 3, wherein:

the discharge gas further comprising a reducing gas.

5. The method of claim 4, wherein the reducing gas is hydrogen.

6. The method of any one of claims 1 to 3, wherein:

a frequency of the second high frequency electric field $\omega 2$ is higher than a frequency of the first high frequency electric field $\omega 1$;

intensity of the first high frequency electric field V1, intensity of the second high frequency electric field V2, and intensity of discharge starting electric field IV1 satisfy one of the formulas:

$$V1 \geq IV1 > V2 \text{ and } V1 > IV1 \geq V2; \text{ and}$$

a power density of the second high frequency electric field is nor less than 1 W/cm$^2$.

7. The method of claim 6, wherein:

high frequency electric field B is formed by superposing a third high frequency electric field and a fourth high frequency electric field.

8. The method of claim 7, wherein:

a discharge space of the second process is formed between a third electrode and a fourth electrode which are facing each other; and the third high frequency electric field is applied by the third electrode and the fourth high frequency electric field is applied by the fourth electrode.

9. The method of claim 8, wherein the first electrode and the third electrode are common.

10. The method of claim 7, wherein:

a frequency of the fourth high frequency electric field $\omega 4$ is higher than a frequency of the third high frequency electric field $\omega 3$;

intensity of the third high frequency electric field V3, intensity of the fourth high frequency electric field V4, and intensity of discharge starting electric field IV2 satisfy one of the formulas:

$$V3 \geq IV2 > V4 \text{ and } V3 > IV2 \geq V4; \text{ and}$$

a power density of the fourth high frequency electric field is not less than 1 W/cm$^2$.

11. The method of claim 3, wherein the film is a metal oxide film.

12. The method of claim 3, wherein the film is a transparent conductive film.

13. The method of claim 3, wherein the film forming gas contains an organo-metallic compound having a metal atom selected from the group consisting of indium (In), tin (Sn), zinc (Zn), zirconium (Zr), antimony (Sb), aluminum (Al), gallium (Ga) and germanium (Ge).

14. The method of claim 3, wherein the first process and the second process are alternately repeated a plurality of times.

15. The method of claim 3, wherein a thickness of the accumulated film in the first process per batch is not more than 10 nm.

16. A substrate having thereon the film formed by the method of claim 3.

17. A method for forming a film comprising a first process and a second process, the first process comprising the steps of:

(i) supplying gas 1 containing a film forming gas to a first discharge space of an atmospheric pressure plasma processing apparatus at atmospheric pressure or at approximately atmospheric pressure the first discharge space is formed between a first electrode and a second electrode which are facing each other;

(ii) applying high frequency electric field A to the first discharge space, whereby gas 1 is excited; and (iii) exposing a substrate to the excited gas 1 whereby a film is formed on the substrate, wherein (a) the high frequency electric field A is formed by superposing a first high frequency electric field and a second high frequency electric field, the first high frequency electric field is applied to the first electrode and the second high frequency electric field applied to the second electrode;

(b) a frequency of the second high frequency electric field $\omega 2$ is higher than a frequency of the first high frequency electric field $\omega 1$;

(c) intensity of the first high frequency electric field V1, intensity of the second high frequency electric field V2, and intensity of discharge starting electric field IV1 satisfy one of the following formulas:

$$V1 \geq IV1 > V2 \text{ and } V1 > IV1 \geq V2;$$

(d) a power density of the second high frequency electric field is not less than 1 W/cm$^2$;

(e) gas 1 contains a reducing gas and a discharge gas;

(f) the discharge gas contains nitrogen of which content is 50% by volume or more based on a volume of a discharge gas in addition to the film forming gas; and (g) the film forming gas contains an organo-titanium compound, the second process comprising the steps of:

(iv) supplying gas 2 containing an oxidizing gas to a second discharge space of the atmospheric pressure plasma processing apparatus at atmospheric pressure or at approximately atmospheric pressure;

(v) applying high frequency electric field B to the second discharge space, whereby gas 2 is excited; and (vi) exposing a substrate having thereon a film formed by gas 1 to excited gas 2, and moving the substrate between the first discharge space and the second discharge space.

18. The method of claim 17, wherein the reducing gas is hydrogen.

19. The method of claim 17, wherein:

high frequency electric field B is formed by superposing a third high frequency electric field and a fourth high frequency electric field.

20. The method of claim 19, wherein:

the second discharge space of the second process is formed between a third electrode and a fourth electrode which are facing each other; and the third high frequency electric field is applied by the third electrode and the fourth high frequency electric field is applied by the fourth electrode.

21. The method of claim 20, wherein the first electrode and the third electrode are common.

22. The method of claim 19, wherein:

a frequency of the fourth high frequency electric field $\omega 4$ is higher than a frequency of the third high frequency electric field represented by $\omega 3$;

intensity of the third high frequency electric field V3, intensity of the fourth high frequency electric field V4, and intensity of discharge starting electric field IV2 satisfy one of the following formulas:

$$V3 \geq IV2 > V4 \text{ and } V3 > IV2 \geq V4; \text{ and}$$

a power density of the fourth high frequency electric field is not less than 1 w/cm².

23. The method of claim 17, wherein the first process and the second process are alternately repeated a plurality of times.

24. The method of claim 17, wherein a thickness of the film accumulated in the first process per time is not more than 20 nm.

* * * * *